(12) United States Patent
Haruna

(10) Patent No.: US 12,028,964 B2
(45) Date of Patent: Jul. 2, 2024

(54) SHIELDED PRINTED WIRING BOARD, METHOD FOR MANUFACTURING SHIELDED PRINTED WIRING BOARD, AND CONNECTING MEMBER

(71) Applicant: Tatsuta Electric Wire & Cable Co., Ltd., Higashiosaka (JP)

(72) Inventor: Yuusuke Haruna, Kizugawa (JP)

(73) Assignee: Tatsuta Electric Wire & Cable Co., Ltd., Higashiosaka (JP)

( * ) Notice: Subject to any disclaimer, the term of this patent is extended or adjusted under 35 U.S.C. 154(b) by 428 days.

(21) Appl. No.: 17/440,323

(22) PCT Filed: Mar. 17, 2020

(86) PCT No.: PCT/JP2020/011799
§ 371 (c)(1),
(2) Date: Sep. 17, 2021

(87) PCT Pub. No.: WO2020/189686
PCT Pub. Date: Sep. 24, 2020

(65) Prior Publication Data
US 2022/0046788 A1    Feb. 10, 2022

(30) Foreign Application Priority Data
Mar. 19, 2019    (JP) ................ 2019-051386

(51) Int. Cl.
*H05K 1/02* (2006.01)
*H05K 1/18* (2006.01)
*H05K 9/00* (2006.01)

(52) U.S. Cl.
CPC .......... *H05K 1/0218* (2013.01); *H05K 1/182* (2013.01); *H05K 9/0084* (2013.01)

(58) Field of Classification Search
CPC .. H05K 1/0215; H05K 1/0216; H05K 1/0218; H05K 1/0393; H05K 1/182;
(Continued)

(56) References Cited

U.S. PATENT DOCUMENTS

2017/0141820 A1\* 5/2017 Kim .................... H04M 1/0266

FOREIGN PATENT DOCUMENTS

JP    2012156457 A    8/2012
JP    2017059802 A  \*  3/2017  ............... H05K 1/02
(Continued)

OTHER PUBLICATIONS

International Search Report dated Jun. 16, 2020, issued in International Application No. PCT/JP2020/011799.
(Continued)

*Primary Examiner* — Timothy J Thompson
*Assistant Examiner* — Guillermo J Egoavil
(74) *Attorney, Agent, or Firm* — United IP Counselors, LLC; Kenneth M. Fagin

(57) ABSTRACT

A shielded printed wiring board includes a substrate film including a base film and printed circuits including a ground circuit formed on the base film; an electromagnetic wave shielding film including a shielding layer and an insulating layer; and a reinforcing member including a conductive adhesive layer and a metal reinforcing plate, wherein the ground circuit of the substrate film is sufficiently electrically connected to the metal reinforcing plate of the reinforcing member. The shielded printed wiring board of the present invention includes a substrate film including a base film and printed circuits including a ground circuit formed on the base film; an electromagnetic wave shielding film including a shielding layer and an insulating layer; a connecting member including a metal foil and a conductive filler fixed to the metal foil with an adhesive resin; and a reinforcing
(Continued)

member including a conductive adhesive layer and a metal reinforcing plate, wherein the electromagnetic wave shielding film is arranged on the substrate film in such a manner that the insulating layer of the electromagnetic wave shielding film is located on the shielding layer of the electromagnetic wave shielding film, the connecting member is arranged on the electromagnetic wave shielding film in such a manner that the conductive filler of the connecting member penetrates the insulating layer of the electromagnetic wave shielding film and that the conductive filler of the connecting member is in contact with the shielding layer of the electromagnetic wave shielding film, the reinforcing member is arranged on the electromagnetic wave shielding film and the connecting member in such a manner that the conductive adhesive layer of the reinforcing member is in contact with the insulating layer of the electromagnetic wave shielding film and the metal foil of the connecting member, and the ground circuit of the substrate film is electrically connected to the metal reinforcing plate of the reinforcing member.

15 Claims, 15 Drawing Sheets

(58) Field of Classification Search
CPC .......... H05K 1/02; H05K 1/18; H05K 3/0061; H05K 9/0084; H05K 9/00
USPC ......................................................... 174/250
See application file for complete search history.

(56) References Cited

FOREIGN PATENT DOCUMENTS

| | | | |
|---|---|---|---|
| JP | 2017059802 A | 3/2017 | |
| JP | 2018053155 A | 4/2018 | |
| KR | 20170137932 A | 12/2017 | |
| WO | 2018147423 A1 | 8/2018 | |
| WO | WO-2018147423 A1 * | 8/2018 | ............... H05K 1/02 |

OTHER PUBLICATIONS

Written Opinion dated Jun. 16, 2020, issued in International Application No. PCT/JP2020/011799.

* cited by examiner

SHIELDED PRINTED WIRING BOARD, METHOD FOR MANUFACTURING SHIELDED PRINTED WIRING BOARD, AND CONNECTING MEMBER

TECHNICAL FIELD

The present invention relates to a shielded printed wiring board, a method of producing a shielded printed wiring board, and a connecting member.

BACKGROUND ART

Due to smaller size and higher processing, conventional electronic devices such as mobile phones and computers are susceptible to electromagnetic wave noise and other noise coming from the main substrate and outside. This has created a higher demand for printed wiring boards with a shielding film that blocks electromagnetic wave noise and other noise. Such a printed wiring board is used with electronic components for mobile phones, computers, and the like connected thereto. A mounting site where the electronic components are mounted may be distorted when the printed wiring board is bent or the like during use. Thus, a reinforcing member is provided at a position opposite to the mounting site where the electronic components are mounted.

For example, Patent Literature 1 discloses the following shielded printed wiring board as a shielded printed wiring board including such a reinforcing member.

Specifically, Patent Literature 1 discloses a shield printed wiring board including: a base member having a wiring pattern for ground formed thereon; an insulating film covering the base member to cover the wiring pattern for ground; a printed wiring board connected to a mounting site in which an electronic component is disposed on a lower surface of the base member; a conductive layer having the same potential as that of the wiring pattern for ground and arranged to extend to a region opposite to the mounting site; an insulating layer disposed on the conductive layer; a shielding film disposed on the printed wiring board; and a conductive reinforcement member arranged in the region opposite to the mounting site and disposed on the shielding film. The reinforcement member is adhered to the insulating layer with a conductive adhesive containing spherical conductive particles. The insulating layer is formed thinner than the height of projecting portions of the conductive particles projecting from the conductive adhesive after the conductive adhesive is applied. After the conductive adhesive is applied to the insulating layer, the conductive particles are in contact with the conductive layer.

CITATION LIST

Patent Literature

Patent Literature 1: JP 2012-156457 A

SUMMARY OF INVENTION

Technical Problem

When producing the shielded printed wiring board disclosed in Patent Literature 1, after the shielding film is arranged on the printed wiring board, the reinforcing member is arranged by pressing the reinforcing member against the shielding film in such a manner that the spherical conductive particles of the reinforcing member penetrate the insulating layer of the shielding film.

At this point, there are cases where pressure is unevenly applied to the conductive particles of the reinforcing member, and some of the conductive particles thus fail to sufficiently penetrate the insulating layer of the shielding film.

In particular, when the insulating layer of the shielding film includes depressions and/or projections attributable to the circuit pattern or an opening of the ground circuit on the shielded printed wiring board, the reinforcing member and the conductive adhesive cannot follow the depressions and/or projections, making it difficult for the conductive particles to penetrate the insulating layer of the shielding film in some cases.

When the conductive particles fail to sufficiently penetrate the insulating layer of the shielding film, such a case leads to an increase in the electrical resistance value.

The present invention was made in view of the above issues. The present invention aims to provide a shielded printed wiring board including a substrate film including a base film and printed circuits including a ground circuit formed on the base film; an electromagnetic wave shielding film including a shielding layer and an insulating layer; and a reinforcing member including a conductive adhesive layer and a metal reinforcing plate, wherein the ground circuit of the substrate film is sufficiently electrically connected to the metal reinforcing plate of the reinforcing member.

Solution to Problem

The shielded printed wiring board of the present invention includes: a substrate film including a base film and printed circuits including a ground circuit formed on the base film; an electromagnetic wave shielding film including a shielding layer and an insulating layer; a connecting member including a metal foil and a conductive filler fixed to the metal foil with an adhesive resin; and a reinforcing member including a conductive adhesive layer and a metal reinforcing plate, wherein the electromagnetic wave shielding film is arranged on the substrate film in such a manner that the insulating layer of the electromagnetic wave shielding film is located on the shielding layer of the electromagnetic wave shielding film, the connecting member is arranged on the electromagnetic wave shielding film in such a manner that the conductive filler of the connecting member penetrates the insulating layer of the electromagnetic wave shielding film and that the conductive filler of the connecting member is in contact with the shielding layer of the electromagnetic wave shielding film, the reinforcing member is arranged on the electromagnetic wave shielding film and the connecting member in such a manner that the conductive adhesive layer of the reinforcing member is in contact with the insulating layer of the electromagnetic wave shielding film and the metal foil of the connecting member, and the ground circuit of the substrate film is electrically connected to the metal reinforcing plate of the reinforcing member.

Another shielded printed wiring board of the present invention includes: a substrate film including a base film and printed circuits including a ground circuit formed on the base film; an electromagnetic wave shielding film including a shielding layer and an insulating layer; a connecting member including a metal foil and a conductive protrusion formed on the metal foil; and a reinforcing member including a conductive adhesive layer and a metal reinforcing plate, wherein the electromagnetic wave shielding film is arranged on the substrate film in such a manner that the insulating layer of the electromagnetic wave shielding film is located on the shielding layer of the electromagnetic wave shielding film, the connecting member is arranged on the electromagnetic wave shielding film in such a manner that the conductive protrusion of the connecting member penetrates the insulating layer of the electromagnetic wave shielding film and that the conductive protrusion of the connecting member is in contact with the shielding layer of the electromagnetic wave shielding film, the reinforcing member is arranged on the electromagnetic wave shielding film and the connecting member in such a manner that the conductive adhesive layer of the reinforcing member is in contact with the insulating layer of the electromagnetic wave shielding film and the metal foil of the connecting member, and the ground circuit of the substrate film is electrically connected to the metal reinforcing plate of the reinforcing member.

Still another shielded printed wiring board of the present invention includes: a substrate film including a base film and printed circuits including a ground circuit formed on the base film; an electromagnetic wave shielding film including a shielding layer and an insulating layer; a connecting member including a mountain fold portion formed of a repeatedly folded metal foil; and a reinforcing member including a conductive adhesive layer and a metal reinforcing plate, wherein the electromagnetic wave shielding film is arranged on the substrate film in such a manner that the insulating layer of the electromagnetic wave shielding film is located on the shielding layer of the electromagnetic wave shielding film, the connecting member is arranged on the electromagnetic wave shielding film in such a manner that the mountain fold portion of the connecting member penetrates the insulating layer of the electromagnetic wave shielding film and that the mountain fold portion of the connecting member is in contact with the shielding layer of the electromagnetic wave shielding film, the reinforcing member is arranged on the electromagnetic wave shielding film and the connecting member in such a manner that the conductive adhesive layer of the reinforcing member is in contact with the insulating layer of the electromagnetic wave shielding film and the metal foil of the connecting member, and the ground circuit of the substrate film is electrically connected to the metal reinforcing plate of the reinforcing member.

In each of the shielded printed wiring boards of the present invention, the connecting member is used to electrically connect the ground circuit of the substrate film to the metal reinforcing plate of the reinforcing member.

Specifically, in each of the shielded printed wiring boards of the present invention, the conductive filler, conductive protrusion, or mountain fold portion of the connecting member penetrates the insulating layer of the electromagnetic wave shielding film, and the conductive filler, conductive protrusion, or mountain fold portion of the connecting member is in contact with the shielding layer of the electromagnetic wave shielding film.

Thus, in each of the shielded printed wiring boards of the present invention, the metal reinforcing plate of the reinforcing member can be electrically connected to the shielding layer of the electromagnetic wave shielding film via the connecting member.

Thus, in each of the shielded printed wiring boards of the present invention, the ground circuit of the substrate film can be electrically connected to the metal reinforcing plate of the reinforcing member via the connecting member.

In the production of a conventional shielded printed wiring board, the conductive filler or the like is arranged on the conductive adhesive layer of the reinforcing member, and pressure is applied to the metal reinforcing plate of the reinforcing member in such a manner that the conductive filler or the like penetrates the insulating layer of the electromagnetic wave shielding film. However, in such a method, there are cases where the pressure is dispersed, and the conductive filler or the like thus fails to sufficiently penetrate the insulating layer of the electromagnetic wave shielding film.

The metal foil of the connecting member defining the shielded printed wiring board of the present invention is likely to allow pressure to be evenly applied thereto, compared to the metal reinforcing plate of the reinforcing member. Thus, in the production of the shielded printed wiring board of the present invention, the conductive filler, conductive protrusion, or mountain fold portion of the connecting member can easily and sufficiently penetrate the insulating layer of the electromagnetic wave shielding film.

Thus, in each of the produced shielded printed wiring boards of the present invention, the conductive filler, conductive protrusion, or mountain fold portion of the connecting member can be sufficiently in contact with the shielding layer of the electromagnetic wave shielding film. This results in a low the electrical resistance value between the electromagnetic wave shielding film and the connecting member.

As a result, in each of the shielded printed wiring boards of the present invention, the ground circuit of the substrate film is sufficiently electrically connected to the metal reinforcing plate of the reinforcing member.

Each of the shielded printed wiring boards of the present invention may be configured as follows: the insulating layer of the electromagnetic wave shielding film includes at least one of a projection or a depression, and the connecting member is arranged across a boundary of the at least one of a projection or a depression of the insulating layer of the electromagnetic wave shielding film.

In the production of a conventional shielded printed wiring board, the conductive filler or the like is arranged on the conductive adhesive layer of the reinforcing member, and pressure is applied to the reinforcing member in such a manner that the conductive filler or the like penetrates the insulating layer of the electromagnetic wave shielding film.

In such a case, when the insulating layer of the electromagnetic wave shielding film includes at least one of a projection or a depression attributable to a printed circuit or the like on a substrate film, there are cases where the pressure is easily dispersed, and the conductive filler or the like thus fails to sufficiently penetrate the insulating layer of the electromagnetic wave shielding film.

The metal foil of the connecting member defining the shielded printed wiring board of the present invention is flexible and can easily change its shape. Thus, even when the insulating layer of the electromagnetic wave shielding film includes at least one of a depression or a projection, the metal foil can change its shape according to the shape of the at least one of a depression or a projection.

Thus, even when the insulating layer of the electromagnetic wave shielding film includes at least one of a depression or a projection, the conductive filler, conductive protrusion, or mountain fold portion of the connecting member can sufficiently penetrate the insulating layer of the electromagnetic wave shielding film.

One of the shielded printed wiring boards of the present invention may be configured as follows: the electromagnetic wave shielding film further includes a conductive adhesive layer; the electromagnetic wave shielding film sequentially includes the conductive adhesive layer of the electromagnetic wave shielding film, the shielding layer of the electromagnetic wave shielding film, and the insulating layer of the electromagnetic wave shielding film that are laminated; the shielding layer of the electromagnetic wave shielding film is made of metal; and the conductive adhesive layer of the electromagnetic wave shielding film is in contact with the ground circuit of the substrate film.

Another shielded printed wiring board of the present invention may be configured as follows: the electromagnetic wave shielding film sequentially includes the shielding layer of the electromagnetic wave shielding film and the insulating layer of the electromagnetic wave shielding film that are laminated; the shielding layer of the electromagnetic wave shielding film is made of a conductive adhesive; and the shielding layer of the electromagnetic wave shielding film is in contact with the ground circuit of the substrate film.

Still another shielded printed wiring board of the present invention may be configured as follows: the electromagnetic wave shielding film further includes an insulating adhesive layer; the electromagnetic wave shielding film sequentially includes the insulating adhesive layer of the electromagnetic wave shielding film, the shielding layer of the electromagnetic wave shielding film, and the insulating layer of the electromagnetic wave shielding film that are laminated; the shielding layer of the electromagnetic wave shielding film is made of metal; the shielding layer of the electromagnetic wave shielding film has a roughened surface adjacent to the insulating adhesive layer of the electromagnetic wave shielding film; and a part of the shielding layer of the electromagnetic wave shielding film penetrates the insulating adhesive layer of the electromagnetic wave shielding film and is in contact with the ground circuit of the substrate film.

In each of the shielded printed wiring boards of the present invention, the electromagnetic wave shielding film can perform its function even when it is configured as described above.

One of the methods of producing a shielded printed wiring board of the present invention includes: a substrate film preparation step of preparing a substrate film including a base film and printed circuits including a ground circuit formed on the base film; an electromagnetic wave shielding film arrangement step of laminating an electromagnetic wave shielding film including a shielding layer and an insulating layer on the substrate film in such a manner that the insulating layer of the electromagnetic wave shielding film is located on the shielding layer of the electromagnetic wave shielding film; a connecting member arrangement step of arranging a connecting member including a metal foil and a conductive filler fixed to the metal foil with an adhesive resin on the electromagnetic wave shielding film in such a manner that the conductive filler of the connecting member penetrates the insulating layer of the electromagnetic wave shielding film and is in contact with the shielding layer of the electromagnetic wave shielding film; and a reinforcing member arrangement step of arranging a reinforcing member including a conductive adhesive layer and a metal reinforcing plate in such a manner that the conductive adhesive layer of the reinforcing member is in contact with the insulating layer of the electromagnetic wave shielding film and the metal foil of the connecting member.

Another method of producing a shielded printed wiring board of the present invention includes: a substrate film preparation step of preparing a substrate film including a base film and printed circuits including a ground circuit formed on the base film; an electromagnetic wave shielding film arrangement step of laminating an electromagnetic wave shielding film including a shielding layer and an insulating layer on the substrate film in such a manner that the insulating layer of the electromagnetic wave shielding film is located on the shielding layer of the electromagnetic wave shielding film; a connecting member arrangement step of arranging a connecting member including a metal foil and a conductive protrusion formed on the metal foil on the electromagnetic wave shielding film in such a manner that the conductive protrusion of the connecting member penetrates the insulating layer of the electromagnetic wave shielding film and is in contact with the shielding layer of the electromagnetic wave shielding film; and a reinforcing member arrangement step of arranging a reinforcing member including a conductive adhesive layer and a metal reinforcing plate in such a manner that the conductive adhesive layer of the reinforcing member is in contact with the insulating layer of the electromagnetic wave shielding film and the metal foil of the connecting member.

Still another method of producing a shielded printed wiring board of the present invention includes: a substrate film preparation step of preparing a substrate film including a base film and printed circuits including a ground circuit formed on the base film; an electromagnetic wave shielding film arrangement step of laminating an electromagnetic wave shielding film including a shielding layer and an insulating layer on the substrate film in such a manner that the insulating layer of the electromagnetic wave shielding film is located on the shielding layer of the electromagnetic wave shielding film; a connecting member arrangement step of arranging a connecting member including a mountain fold portion formed of a repeatedly folded metal foil on the electromagnetic wave shielding film in such a manner that the mountain fold portion of the connecting member penetrates the insulating layer of the electromagnetic wave shielding film and is in contact with the shielding layer of the electromagnetic wave shielding film; and a reinforcing member arrangement step of arranging a reinforcing member including a conductive adhesive layer and a metal reinforcing plate in such a manner that the conductive adhesive layer of the reinforcing member is in contact with the insulating layer of the electromagnetic wave shielding film and the metal foil of the connecting member.

Each of the methods of producing a shielded printed wiring board of the present invention includes arranging the conductive filler, conductive protrusion, or mountain fold portion of the connecting member on the electromagnetic wave shielding film in such a manner that the conductive filler, conductive protrusion, or mountain fold portion of the connecting member penetrates the insulating layer of the electromagnetic wave shielding film and is in contact with the shielding layer of the electromagnetic wave shielding film.

This results in a low the electrical resistance value between the electromagnetic wave shielding film and the connecting member in each of the resulting shielded printed wiring boards.

Thus, each of the methods of producing a shielded printed wiring board of the present invention can produce a shielded printed wiring board in which the ground circuit of the substrate film is sufficiently electrically connected to the metal reinforcing plate of the reinforcing member.

In each of the methods of producing a shielded printed wiring boards of the present invention, the insulating layer of the electromagnetic wave shielding film may include at least one of a projection or a depression, and in the connecting member arrangement step, the connecting member may be arranged across a boundary of the at least one of a projection or a depression of the insulating layer of the electromagnetic wave shielding film.

The metal foil of the connecting member is flexible and can easily change its shape. Thus, even when the insulating layer of the electromagnetic wave shielding film includes at least one of a depression or a projection, the metal foil can change its shape according to the shape of the at least one of a depression or a projection.

Thus, even when the insulating layer of the electromagnetic wave shielding film includes at least one of a depression or a projection, the conductive filler, conductive protrusion, or mountain fold portion of the connecting member can sufficiently penetrate the insulating layer of the electromagnetic wave shielding film.

The connecting member including a metal foil and a conductive filler fixed to the metal foil with an adhesive resin, which is used in each of the methods of producing a shielded printed wiring board of the present invention, is the connecting member of the present invention.

The connecting member including a metal foil and a conductive protrusion formed on the metal foil, which is used in each of the methods of producing a shielded printed wiring board of the present invention, is the connecting member of the present invention.

The connecting member including a mountain fold portion formed of a repeatedly folded metal foil, which is used in each of the methods of producing a shielded printed wiring board of the present invention, is the connecting member of the present invention.

Use of any of these connecting members of the present invention in the production of a shielded printed wiring board makes it possible to produce a shielded printed wiring board in which the ground circuit of the substrate film is sufficiently electrically connected to the metal reinforcing plate of the reinforcing member.

Advantageous Effects of Invention

In each of the shielded printed wiring boards of the present invention, the conductive filler, conductive protrusion, or mountain fold portion of the connecting member penetrates the insulating layer of the electromagnetic wave shielding film, and the conductive filler, conductive protrusion, or mountain fold portion of the connecting member is in contact with the shielding layer of the electromagnetic wave shielding film.

Thus, in each of the shielded printed wiring boards of the present invention, the metal reinforcing plate of the reinforcing member can be electrically connected to the conductive filler, conductive protrusion, or mountain fold portion of the connecting member, via the conductive adhesive layer of the reinforcing member and the metal foil of the connecting member.

Thus, in each of the shielded printed wiring boards of the present invention, the ground circuit of the substrate film can be electrically connected to the metal reinforcing plate of the reinforcing member via the connecting member.

The metal foil of the connecting member defining the shielded printed wiring board of the present invention is likely to allow pressure to be evenly applied thereto. Thus, in the production of the shielded printed wiring board of the present invention, the conductive filler, conductive protrusion, or mountain fold portion of the connecting member can easily and sufficiently penetrate the insulating layer of the electromagnetic wave shielding film.

Thus, in each of the produced shielded printed wiring boards of the present invention, the conductive filler, conductive protrusion, or mountain fold portion of the connecting member can be sufficiently in contact with the shielding layer of the electromagnetic wave shielding film. This results in a low the electrical resistance value between the electromagnetic wave shielding film and the connecting member.

As a result, in each of the shielded printed wiring boards of the present invention, the ground circuit of the substrate film is sufficiently electrically connected to the metal reinforcing plate of the reinforcing member.

DESCRIPTION OF EMBODIMENTS

The following specifically describes the shielded printed wiring board of the present invention. The present invention is not limited to the following embodiments, and suitable modifications may be made without departing from the gist of the present invention.

First Embodiment

Figure 1:
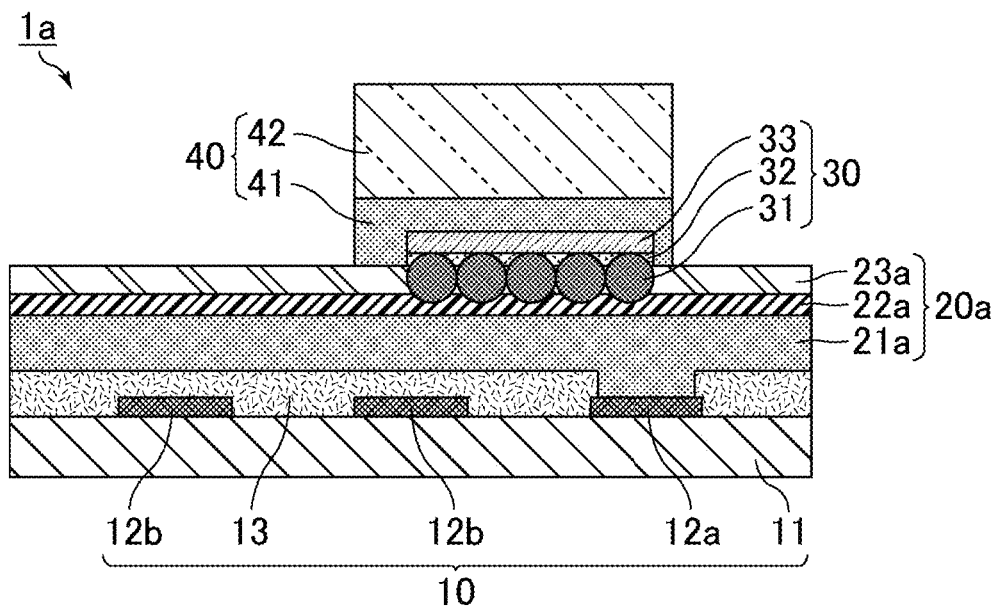
FIG. 1 is a schematic cross-sectional view of a shielded printed wiring board according to a first embodiment of the present invention.

FIG. 1 is an exemplary schematic cross-sectional view of a shielded printed wiring board according to a first embodiment of the present invention.

As shown in FIG. 1, a shielded printed wiring board 1a according to the first embodiment of the present invention includes the followings: a substrate film 10 including a base film 11, and a ground circuit 12a and other printed circuits 12b formed on the base film 11; an electromagnetic wave shielding film 20a sequentially including a conductive adhesive layer 21a, a shielding layer 22a, and an insulating layer 23a that are laminated; a connecting member 30 including a metal foil 33 and a conductive filler 31 fixed to the metal foil 33 with an adhesive resin 32; and a reinforcing member 40 including a conductive adhesive layer 41 and a metal reinforcing plate 42.

In the shielded printed wiring board 1a, the printed circuits 12b of the substrate film 10 are covered by a coverlay 13, and the ground circuit 12a of the substrate film 10 is not covered by the coverlay 13.

In the shielded printed wiring board 1a, the electromagnetic wave shielding film 20a is arranged on the substrate film 10 in such a manner that the conductive adhesive layer 21a of the electromagnetic wave shielding film 20a is in contact with the ground circuit 12a of the substrate film 10.

In the shielded printed wiring board 1a, the printed circuits 12b of the substrate film 10 are covered by the coverlay 13, so that the printed circuits 12b are not in contact with the conductive adhesive layer 21a of the electromagnetic wave shielding film 20a.

In the shielded printed wiring board 1a, the connecting member 30 is arranged on the electromagnetic wave shielding film 20a in such a manner that the conductive filler 31 of the connecting member 30 penetrates the insulating layer 23a of the electromagnetic wave shielding film 20a and that the conductive filler 31 of the connecting member 30 is in contact with the shielding layer 22a of the electromagnetic wave shielding film 20a.

In the shielded printed wiring board 1a, the reinforcing member 40 is arranged on the electromagnetic wave shielding film 20a and the connecting member 30 in such a manner that the conductive adhesive layer 41 of the reinforcing member 40 is in contact with the insulating layer 23a of the electromagnetic wave shielding film 20a and the metal foil 33 of the connecting member 30.

Further, in the shielded printed wiring board 1a, the ground circuit 12a of the substrate film 10 is electrically connected to the metal reinforcing plate 42 of the reinforcing member 40.

In the shielded printed wiring board 1a, the connecting member 30 is used to electrically connect the ground circuit 12a of the substrate film 10 to the metal reinforcing plate 42 of the reinforcing member 40.

Specifically, in the shielded printed wiring board 1a, the conductive filler 31 of the connecting member 30 penetrates the insulating layer 23a of the electromagnetic wave shielding film 20a, and the conductive filler 31 of the connecting member 30 is in contact with the shielding layer 22a of the electromagnetic wave shielding film 20a.

Thus, in the shielded printed wiring board 1a, the metal reinforcing plate 42 of the reinforcing member 40 can be electrically connected to the shielding layer 22a of the electromagnetic wave shielding film 20a via the connecting member 30.

Thus, in the shielded printed wiring board 1a, the ground circuit 12a of the substrate film 10 can be electrically connected to the metal reinforcing plate 42 of the reinforcing member 40 via the connecting member 30.

In the production of a conventional shielded printed wiring board, the conductive filler or the like is arranged on the conductive adhesive layer of the reinforcing member, and pressure is applied to the metal reinforcing plate of the reinforcing member in such a manner that the conductive filler or the like penetrates the insulating layer of the electromagnetic wave shielding film. However, in such a method, there are cases where the pressure is dispersed, and the conductive filler or the like thus fails to sufficiently penetrate the insulating layer of the electromagnetic wave shielding film.

The metal foil 33 of the connecting member 30 defining the shielded printed wiring board 1a is likely to allow pressure to be evenly applied thereto, compared to the metal reinforcing plate 42 of the reinforcing member 40. Thus, in the production of the shielded printed wiring board 1a, the conductive filler 31 of the connecting member 30 can easily and sufficiently penetrate the insulating layer 23a of the electromagnetic wave shielding film 20a.

Thus, in the produced shielded printed wiring board 1a, the conductive filler 31 of the connecting member 30 can be sufficiently in contact with the shielding layer 22a of the electromagnetic wave shielding film 20a. This results in a low the electrical resistance value between the electromagnetic wave shielding film 20a and the connecting member 30.

As a result, in the shielded printed wiring board 1a, the ground circuit 12a of the substrate film 10 is sufficiently electrically connected to the metal reinforcing plate 42 of the reinforcing member 40.

An electronic component will be mounted on the shielded printed wiring board 1a.

Arranging the reinforcing member 40 on a side opposite to the mounting site where an electronic component is to be mounted can reinforce the mounting site.

This can prevent the mounting site from being distorted or the like when mounting an electronic component on the shielded printed wiring board 1a.

The shielded printed wiring board according to the first embodiment of the present invention may be configured as follows: the insulating layer of the electromagnetic wave shielding film includes at least one of a projection or a depression, and the connecting member is arranged across a boundary of the at least one of a projection or a depression of the insulating layer of the electromagnetic wave shielding film.

First, a conventional shielded printed wiring board in which no connecting member is used is described, before describing the shielded printed wiring board according to the first embodiment of the present invention in which the insulating layer of the electromagnetic wave shielding film includes at least one of a depression or a projection.

In the conventional shielded printed wiring board, the substrate film includes a ground circuit and other printed circuit(s), so that at least one of a depression or a projection is formed in or on the substrate film.

When the electromagnetic wave shielding film is arranged on the substrate film including at least one of a depression or a projection, the insulating layer of the electromagnetic wave shielding film may include at least one of a depression or a projection attributable to the at least one of a depression or a projection of the substrate film.

Such a depression and/or a projection is easily formed in or on the insulating layer of the electromagnetic wave shielding film, especially when the conductive adhesive layer of the electromagnetic wave shielding film is thin.

The following describes, with reference to the drawing, a case where the reinforcing member is arranged, without using a connecting member, on the electromagnetic wave shielding film whose insulating layer includes at least one of a depression or a projection.

Figure 2:
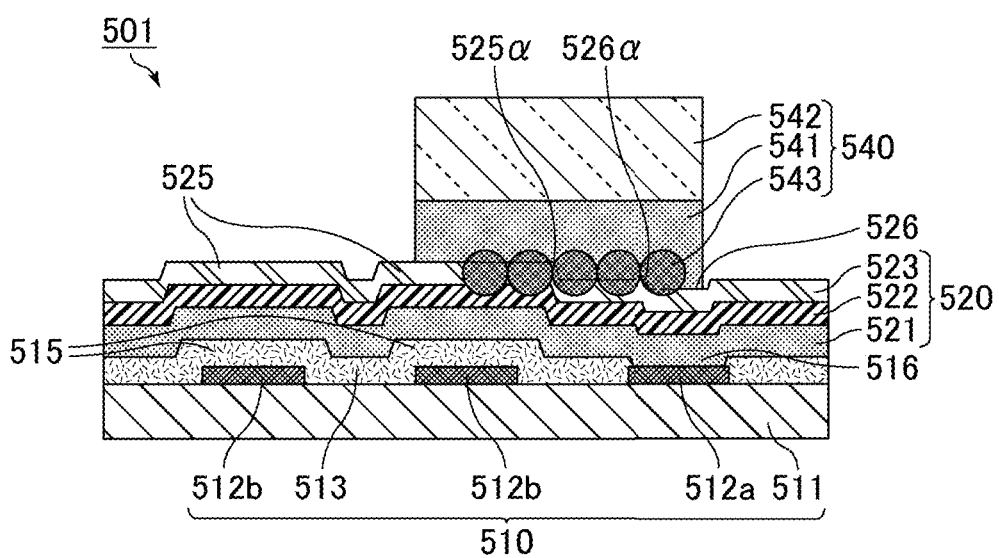
FIG. 2 is an exemplary schematic cross-sectional view of a shielded printed wiring board in which a reinforcing member is arranged, without using a connecting member, on an electromagnetic wave shielding film whose insulating layer includes a depression and a projection.

FIG. 2 is an exemplary schematic cross-sectional view of the shielded printed wiring board in which the reinforcing member is arranged, without using a connecting member, on the electromagnetic wave shielding film whose insulating layer includes a depression and a projection.

As shown in FIG. 2, a conventional shielded printed wiring board 501 includes the followings: a substrate film 510 including a base film 511, and a ground circuit 512a and other printed circuits 512b formed on the base film 511; an electromagnetic wave shielding film 520 sequentially including a conductive adhesive layer 521, a shielding layer 522, and an insulating layer 523 that are laminated; and a reinforcing member 540 including a conductive adhesive layer 541 containing a conductive filler 543 and a metal reinforcing plate 542.

In the shielded printed wiring board 501, the printed circuits 512b of the substrate film 510 are covered by a coverlay 513, and the ground circuit 512a of the substrate film 510 is not covered by the coverlay 513.

The substrate film 510 includes projections 515 at portions corresponding to the printed circuits 512b covered by the coverlay 513. The substrate film 510 includes a depression 516 at a portion corresponding to the ground circuit 512a because the ground circuit 512a is not covered by the coverlay 513.

In the shielded printed wiring board 501, the electromagnetic wave shielding film 520 is arranged on the substrate film 510 in such a manner that the conductive adhesive layer 521 of the electromagnetic wave shielding film 520 is in contact with the ground circuit 512a.

In the shielded printed wiring board 501, the insulating layer 523 of the electromagnetic wave shielding film 520 includes a depression 526 and projections 525 attributable to the depression 516 and the projections 515, respectively, of the substrate film 510.

In the shielded printed wiring board 501, the reinforcing member 540 is arranged on the electromagnetic wave shielding film 520 in such a manner that the conductive filler 543 of the reinforcing member 540 penetrates the insulating layer 523 of the electromagnetic wave shielding film 520 and that the conductive filler 543 of the reinforcing member 540 is in contact with the shielding layer 522 of the electromagnetic wave shielding film 520.

Further, in the shielded printed wiring board 501, the reinforcing member 540 is arranged across a boundary 526a of the depression 526 and a boundary 525a of the projection 525 of the insulating layer 523 of the electromagnetic wave shielding film 520.

In the production of the shielded printed wiring board 501, the reinforcing member 540 is pressed against the electromagnetic wave shielding film 520, whereby the conductive filler 543 of the reinforcing member 540 penetrates the insulating layer 523 of the electromagnetic wave shielding film 520.

Here, the metal reinforcing plate 542 of the reinforcing member 540 is hard and does not easily change its shape.

Thus, when the insulating layer 523 of the electromagnetic wave shielding film 520 includes the depression 526 and the projections 525, it is difficult to apply even pressure to the entire conductive filler 543 of the reinforcing member 540.

Thus, as shown in FIG. 2, in the shielded printed wiring board 501, the conductive filler 543 of the reinforcing member 540 fails to sufficiently penetrate the insulating layer 523 of the electromagnetic wave shielding film 520.

When the conductive filler 543 of the reinforcing member 540 does not sufficiently penetrate the insulating layer 523 of the electromagnetic wave shielding film 520, the electrical resistance value between the ground circuit 512a of the substrate film 510 and the metal reinforcing plate 542 of the reinforcing member 540 tends to increase.

The following describes, with reference to the drawing, the shielded printed wiring board according to the first embodiment of the present invention in which the insulating layer of the electromagnetic wave shielding film includes at least one of a depression or a projection.

Figure 3:
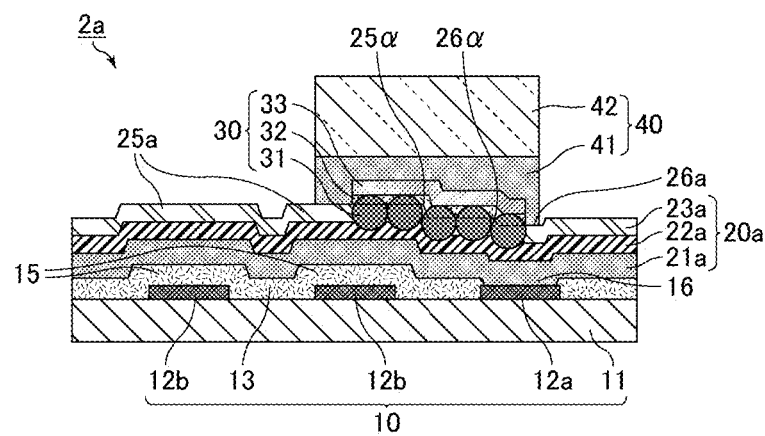
FIG. 3 is another exemplary schematic cross-sectional view of the shielded printed wiring board according to the first embodiment of the present invention.

FIG. 3 is another exemplary schematic cross-sectional view of the shielded printed wiring board according to the first embodiment of the present invention.

As shown in FIG. 3, a shielded printed wiring board 2a includes the substrate film 10, the electromagnetic wave shielding film 20a, the connecting member 30, and the reinforcing member 40, as is the case with the shielded printed wiring board 1a.

In the shielded printed wiring board 2a, the printed circuits 12b of the substrate film 10 are covered by the coverlay 13, and the ground circuit 12a of the substrate film 10 is not covered by the coverlay 13.

The substrate film 10 includes projections 15 at portions corresponding to the printed circuits 12b covered by the coverlay 13. The substrate film 10 includes a depression 16 at a portion corresponding to the ground circuit 12a because the ground circuit 12a is not covered by the coverlay 13.

In the shielded printed wiring board 2a, the electromagnetic wave shielding film 20a is arranged on the substrate film 10 in such a manner that the conductive adhesive layer 21a of the electromagnetic wave shielding film 20a is in contact with the ground circuit 12a.

In the shielded printed wiring board 2a, the insulating layer 23a of the electromagnetic wave shielding film 20a includes a depression 26a and projections 25a attributable to the depression 16 and the projections 15, respectively, of the substrate film 10.

In the shielded printed wiring board 2a, the connecting member 30 is arranged on the electromagnetic wave shielding film 20a in such a manner that the conductive filler 31 of the connecting member 30 penetrates the insulating layer 23a of the electromagnetic wave shielding film 20a and that the conductive filler 31 of the connecting member 30 is in contact with the shielding layer 22a of the electromagnetic wave shielding film 20a.

In the shielded printed wiring board 2a, the connecting member 30 is arranged across a boundary 26a of the depression 26a and a boundary 25a of the projection 25a of the insulating layer 23a of the electromagnetic wave shielding film 20a.

In the shielded printed wiring board 2a, the reinforcing member 40 is arranged on the electromagnetic wave shielding film 20a and the connecting member 30 in such a manner that the conductive adhesive layer 41 of the reinforcing member 40 is in contact with the insulating layer 23a of the electromagnetic wave shielding film 20a and the metal foil 33 of the connecting member 30.

Here, the metal foil 33 of the connecting member 30 is flexible and can easily change its shape. Thus, even when the insulating layer 23a of the electromagnetic wave shielding film 20a includes the depression 26a and the projections 25a, the metal foil 33 of the connecting member 30 can change its shape according to the shapes of the depression 26a and the projections 25a.

Thus, even when the insulating layer 23a of the electromagnetic wave shielding film 20a includes the depression 26a and the projections 25a, the conductive filler 31 of the connecting member 30 can sufficiently penetrate the insulating layer 23a of the electromagnetic wave shielding film 20a.

Thus, in the shielded printed wiring board 2a, the ground circuit 12a of the substrate film 10 is sufficiently electrically connected to the metal reinforcing plate 42 of the reinforcing member 40.

The following describes each structure of a shielded printed wiring board 101a.

(Substrate Film)

The base film 11 and the coverlay 13 defining the substrate film 10 may be formed from any material, but are preferably formed from an engineering plastic. Examples of the engineering plastic include resins such as polyethylene terephthalate, polypropylene, crosslinked polyethylene, polyester, polybenzimidazole, polyimide, polyamide-imide, polyetherimide, and polyphenylene sulfide.

Of these engineering plastic films, a polyphenylene sulfide film is preferred when flame retardancy is required, and a polyimide film is preferred when heat resistance is required. The thickness of the base film 11 is preferably 10 to 40 µm. The thickness of the coverlay 13 is preferably 10 to 50 µm.

The ground circuit 12a and the other printed circuits 12b defining the substrate film 10 are not limited, but can be formed by etching a conductive material, for example.

Examples of the conductive material include known conductive materials such as copper, nickel, and gold. The thickness of each of the ground circuit 12a and the printed circuits 12b is not limited, but it is suitably set in the range of 10 to 100 µm, for example.

(Electromagnetic Wave Shielding Film)

In the electromagnetic wave shielding film 20a, the conductive adhesive layer 21a may be made of any material as long as it has conductivity and can function as an adhesive.

For example, the conductive adhesive layer 21a may be made of conductive particles and an adhesive resin composition.

The conductive particles are not limited, but may be fine metal particles, carbon nanotubes, carbon fibers, metal fibers, or the like.

When the conductive particles are fine metal particles, the fine metal particles are not limited. Examples include silver powder, copper powder, nickel powder, solder powder, aluminum powder, silver-coated copper powder (silver-plated copper powder), and fine particles (such as polymer fine particles and glass beads) coated with metal.

Of these, a copper powder or a silver-coated copper powder, each of which is available at a lower cost, is preferred in terms of economic efficiency.

The average particle size of the conductive particles is not limited, but it is preferably 0.5 to 15.0 µm. Conductive particles having an average particle size of 0.5 µm or more result in a conductive adhesive layer having good conductivity. Conductive particles having an average particle size of 15.0 µm or less can provide a thin conductive adhesive layer.

The shape of the conductive particles is not limited, and it can be suitably selected from spherical, flat, scaly, dendrite, rod, fibrous, and other like shapes.

The material of the adhesive resin composition is not limited. Examples include styrene resin compositions, vinyl acetate resin compositions, polyester resin compositions, polyethylene resin compositions, polypropylene resin compositions, imide resin compositions, amide resin compositions, acrylic resin compositions, and other like thermoplastic resin compositions; and phenolic resin compositions, epoxy resin compositions, urethane resin compositions, melamine resin compositions, alkyd resin compositions, and other like thermosetting resin compositions.

The material of the adhesive resin composition may include only one of these materials or two or more thereof in combination.

The conductive adhesive layer 21a may contain additives such as curing accelerators, tackifiers, antioxidants, pigments, dyes, plasticizers, UV absorbers, defoamers, leveling agents, fillers, flame retardants, or viscosity modifiers, as needed.

The amount of conductive particles in the conductive adhesive layer 21a is not limited, but it is preferably 15 to 80 mass %, more preferably 15 to 60 mass %.

The conductive particles in an amount in the above ranges improve the adhesiveness.

The thickness of the conductive adhesive layer 21a is not limited, and it can be suitably set as needed, but it is preferably 0.5 to 20.0 μm.

A conductive adhesive layer having a thickness of less than 0.5 μm is less likely to provide good conductivity.

A conductive adhesive layer having a thickness of more than 20.0 μm results in a shielded printed wiring board that is entirely thick and difficult to handle.

Preferably, the conductive adhesive layer 21a has anisotropic conductivity.

The conductive adhesive layer 21a, when it has anisotropic conductivity, results in better transmission characteristics of high frequency signals that are transmitted via a signal circuit of the printed wiring board, than when it has isotropic conductivity.

In the electromagnetic wave shielding film 20a, the shielding layer 22a is made of metal.

The shielding layer 22a may include a layer made of a material such as gold, silver, copper, aluminum, nickel, tin, palladium, chromium, titanium, zinc, or the like, and preferably includes a copper layer.

Copper is a material suitable for the shielding layer 22a in terms of conductivity and economic efficiency.

The shielding layer 22a may include a layer made of an alloy of the metals described above.

In the electromagnetic wave shielding film 20a, the insulating layer 23a is not limited as long as it has sufficient insulation and is capable of protecting the conductive adhesive layer 21a and the shielding layer 22a. For example, preferably, the insulating layer 23a is made of a thermoplastic resin composition, a thermosetting resin composition, an active energy ray-curable composition, or the like.

The thermoplastic resin composition is not limited. Examples include styrene resin compositions, vinyl acetate resin compositions, polyester resin compositions, polyethylene resin compositions, polypropylene resin compositions, imide resin compositions, and acrylic resin compositions.

The thermosetting resin composition is not limited. Examples include phenolic resin compositions, epoxy resin compositions, urethane resin compositions, melamine resin compositions, and alkyd resin compositions.

The active energy ray-curable composition is not limited. Examples include polymerizable compounds having at least two (meth)acryloyloxy groups in the molecule.

The insulating layer 23a may be made of a single material or two or more materials.

The insulating layer 23a may contain additives such as curing accelerators, tackifiers, antioxidants, pigments, dyes, plasticizers, UV absorbers, defoamers, leveling agents, fillers, flame retardants, viscosity modifiers, or anti-blocking agents, as needed.

The thickness of the insulating layer 23a is not limited, and it can be suitably set as needed, but it is preferably 1 to 15 μm, more preferably 3 to 10 μm.

An insulating layer having a thickness of less than 1 μm is too thin to sufficiently protect the conductive adhesive layer and the shielding layer.

An insulating layer having a thickness of more than 15 μm is too thick to allow the electromagnetic wave shielding film to be easily bent, and is easily breakable. Thus, such an insulating layer is less applicable to a member that requires bending resistance.

The electromagnetic wave shielding film 20a may include an anchor coat layer between the shielding layer 22a and the insulating layer 23a.

Examples of a material of the anchor coat layer include a urethane resin, an acrylic resin, core-shell composite resins containing a urethane resin as a shell and an acrylic resin as a core, an epoxy resin, an imide resin, an amide resin, a melamine resin, a phenolic resin, a urea formaldehyde resin, blocked isocyanates obtained by reacting a polyisocyanate with a blocking agent such as phenol, polyvinyl alcohol, and polyvinylpyrrolidone.

(Connecting Member)

In the connecting member 30, preferably, the conductive filler 31 includes at least one selected from the group consisting of copper powder, silver powder, nickel powder, silver-coated copper powder, gold-coated copper powder, silver-coated nickel powder, gold-coated nickel powder, and resin particles coated with metal powder.

These particles have excellent conductivity.

In the connecting member 30, the average particle size of the conductive filler 31 is preferably 1 to 200 μm.

A conductive filler having an average particle size of less than 1 μm is too small to penetrate the insulating layer of the electromagnetic wave shielding film.

A conductive filler having an average particle size of more than 200 μm is large, so that a high pressure is required for such a conductive filler to penetrate the insulating layer of the electromagnetic wave shielding film.

In the connecting member 30, the material of the adhesive resin 32 is not limited. Examples include styrene resin compositions, vinyl acetate resin compositions, polyester resin compositions, polyethylene resin compositions, polypropylene resin compositions, imide resin compositions, amide resin compositions, acrylic resin compositions, and other like thermoplastic resin compositions; and phenolic resin compositions, epoxy resin compositions, urethane resin compositions, melamine resin compositions, alkyd resin compositions, and other like thermosetting resin compositions.

The material of the adhesive resin 32 may include only one of these materials or two or more thereof in combination.

In the connecting member 30, the metal foil 33 is not limited as long as it is a conductive metal. For example, preferably, the metal foil 33 includes at least one selected from the group consisting of copper, aluminum, silver, gold, platinum, nickel, chromium, titanium, zinc, and stainless steel.

These materials have excellent conductivity.

In the connecting member 30, the thickness of the metal foil 33 is preferably 0.1 μm or more, more preferably 1 μm or more.

A metal foil having a thickness of less than 0.1 μm has low strength and is easily breakable.

When the electromagnetic wave shielding film 20a includes at least one of a depression or a projection, preferably, the thickness of the metal foil 33 of the connecting member 30 is less than or equal to the distance corresponding to the depth of the depression or the height of the projection, whichever is greater. More preferably, the thickness is less than or equal to 50% of the distance corresponding to the depth of the depression or the height of the projection, whichever is greater.

When the thickness of the metal foil is more than the distance corresponding to the height of the projection or the depth of the projection of the insulating layer of the electromagnetic wave shielding film, whichever is greater, the metal foil reduces its flexibility and cannot easily change its shape according to the shape of the depression and/or projection of the insulating layer of the electromagnetic wave shielding film.

(Reinforcing Member)

In the reinforcing member 40, the conductive adhesive layer 41 may be made of any material as long as it has conductivity and can function as an adhesive.

For example, the conductive adhesive layer 41 may be made of conductive particles and an adhesive resin composition.

The conductive particles are not limited, but may be fine metal particles, carbon nanotubes, carbon fibers, metal fibers, or the like.

When the conductive particles are fine metal particles, the fine metal particles are not limited. Examples include silver powder, copper powder, nickel powder, solder powder, aluminum powder, silver-coated copper powder (silver-plated copper powder), and fine particles (such as polymer fine particles and glass beads) coated with metal.

Of these, a copper powder or a silver-coated copper powder, each of which is available at a lower cost, is preferred in terms of economic efficiency.

The average particle size of the conductive particles is not limited, but it is preferably 0.5 to 15.0 μm. Conductive particles having an average particle size of 0.5 μm or more result in a conductive adhesive layer having good conductivity. Conductive particles having an average particle size of 15.0 μm or less can provide a thin conductive adhesive layer.

The shape of the conductive particles is not limited, and it can be suitably selected from spherical, flat, scaly, dendrite, rod, fibrous, and other like shapes.

The material of the adhesive resin composition is not limited. Examples include styrene resin compositions, vinyl acetate resin compositions, polyester resin compositions, polyethylene resin compositions, polypropylene resin compositions, imide resin compositions, amide resin compositions, acrylic resin compositions, and other like thermoplastic resin compositions; and phenolic resin compositions, epoxy resin compositions, urethane resin compositions, melamine resin compositions, alkyd resin compositions, and other like thermosetting resin compositions.

The material of the adhesive resin composition may include only one of these materials or two or more thereof in combination.

The conductive adhesive layer 41 may contain additives such as curing accelerators, tackifiers, antioxidants, pigments, dyes, plasticizers, UV absorbers, defoamers, leveling agents, fillers, flame retardants, or viscosity modifiers, as needed.

The amount of conductive particles in the conductive adhesive layer 41 is not limited, but it is preferably 15 to 80 mass %, more preferably 15 to 60 mass %.

The conductive particles in an amount in the above ranges improve the adhesiveness.

The thickness of the conductive adhesive layer 41 is not limited, and it can be suitably set as needed, but it is preferably 0.5 to 80.0 μm.

A conductive adhesive layer having a thickness of less than 0.5 μm is less likely to provide good conductivity. A conductive adhesive layer having a thickness of more than 80.0 μm results in a reinforcing member that is entirely thick and difficult to handle.

In the reinforcing member 40, the metal reinforcing plate 42 is made of a conductive metal material. The metal material is not limited as long as it can prevent the mounting site from being distorted or the like due to bending or the like when mounting an electronic component on the shielded printed wiring board 1a.

Examples of such a metal material include copper, aluminum, silver, gold, platinum, nickel, chromium, titanium, zinc, stainless steel, and alloys of these metals.

The thickness of the metal reinforcing plate 42 is preferably 0.05 mm to 1 mm.

A metal reinforcing plate having a thickness of less than 0.05 mm has insufficient strength and results in a shielded printed wiring board that is easily distorted or the like when mounting an electronic component thereon.

A metal reinforcing plate having a thickness of more than 1 mm is bulky, which makes it difficult to arrange the shielded printed wiring board in an electronic device.

The following describes a method of producing the shielded printed wiring board 1a.

This method of producing the shielded printed wiring board is an exemplary method of producing the shielded printed wiring board according to the first embodiment of the present invention.

The method of producing the shielded printed wiring board 1a may include a substrate film preparation step (1), an electromagnetic wave shielding film arrangement step (2), a connecting member arrangement step (3), and a reinforcing member arrangement step (4).

The following specifically describes each step with reference to the drawings.

Figure 4:
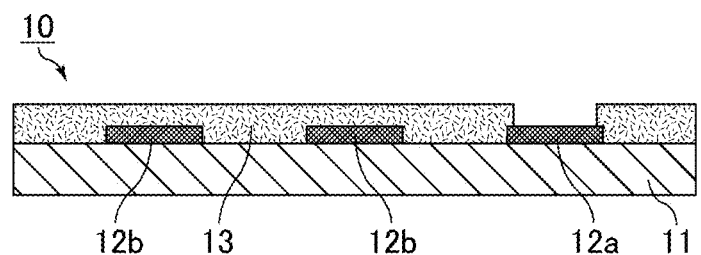
FIG. 4 is a schematic view of an exemplary substrate film preparation step according to the first embodiment of the present invention.

FIG. 4 is a schematic view of an exemplary substrate film preparation step according to the first embodiment of the present invention.

Figure 5A:
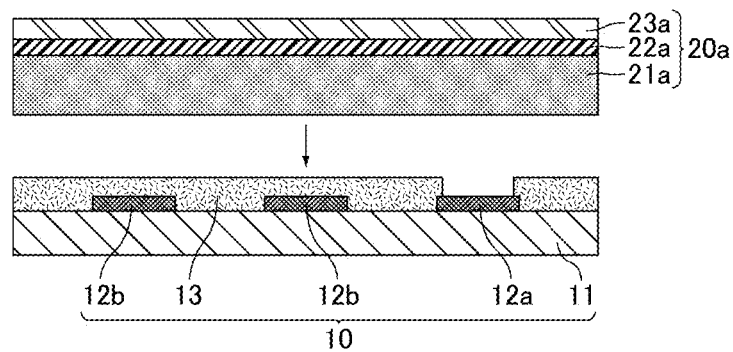
FIG. 5A is a schematic view of an exemplary electromagnetic wave shielding film arrangement step according to the first embodiment of the present invention.
Figure 5B:
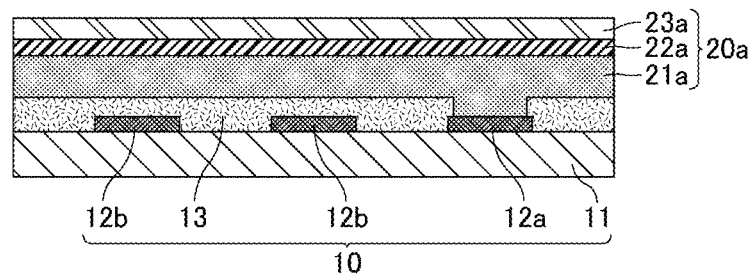
FIG. 5B is a schematic view of an exemplary electromagnetic wave shielding film arrangement step according to the first embodiment of the present invention.

FIG. 5A and FIG. 5B are schematic views of an exemplary electromagnetic wave shielding film arrangement step according to the first embodiment of the present invention.

Figure 6A:
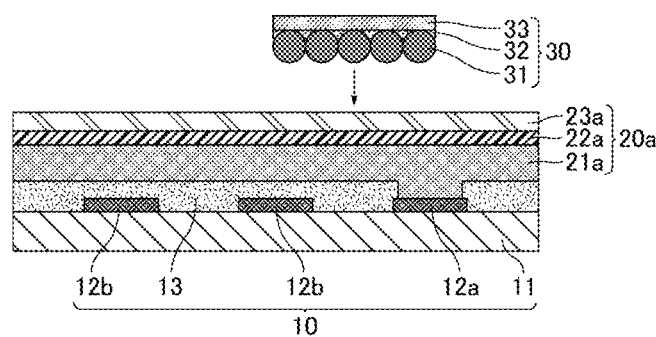
FIG. 6A is a schematic view of an exemplary connecting member arrangement step according to the first embodiment of the present invention.
Figure 6B:
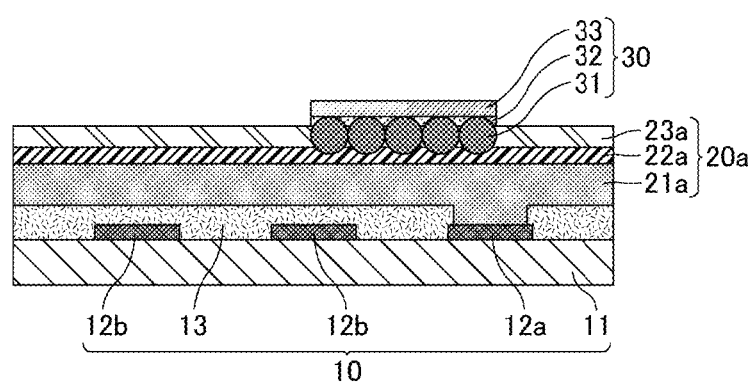
FIG. 6B is a schematic view of an exemplary connecting member arrangement step according to the first embodiment of the present invention.

FIG. 6A and FIG. 6B are schematic views of an exemplary connecting member arrangement step according to the first embodiment of the present invention.

Figure 7A:
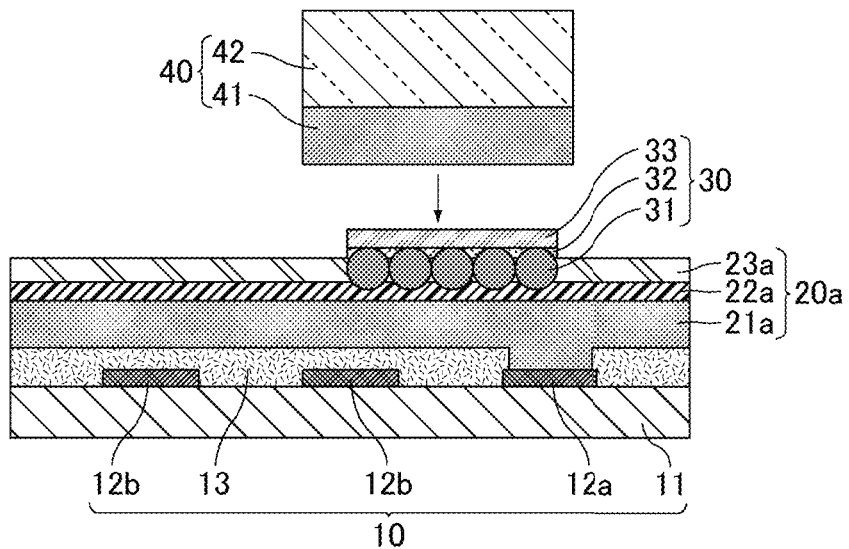
FIG. 7A is a schematic view of an exemplary reinforcing member arrangement step according to the first embodiment of the present invention.
Figure 7B:
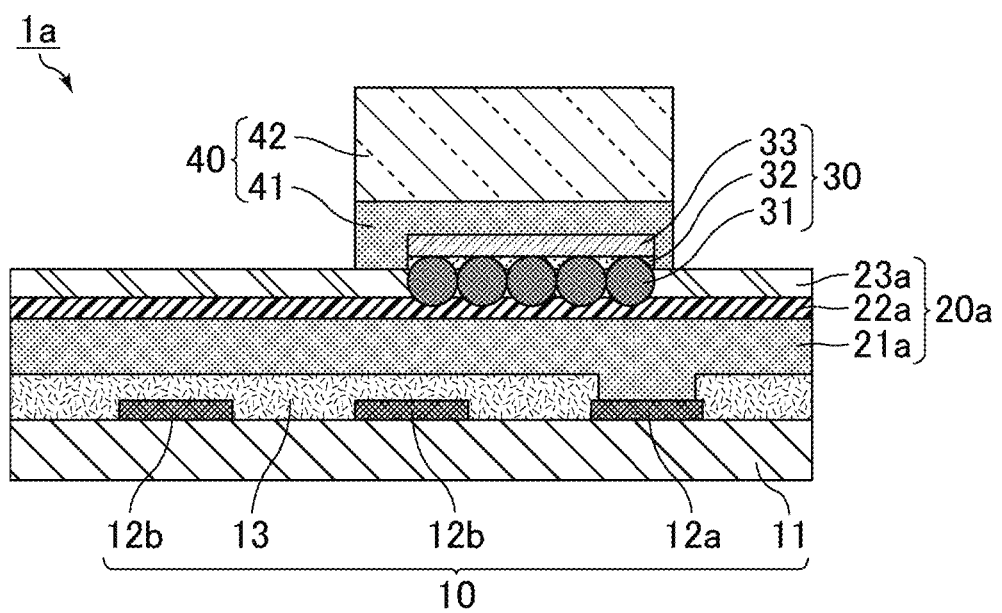
FIG. 7B is a schematic view of an exemplary reinforcing member arrangement step according to the first embodiment of the present invention.

FIG. 7A and FIG. 7B are schematic views of an exemplary reinforcing member arrangement step according to the first embodiment of the present invention.

(1) Substrate Film Preparation Step

First, as shown in FIG. 4, the substrate film 10 is prepared which includes the base film 11, the ground circuit 12a and the other printed circuits 12b formed on the base film 11, and the coverlay 13 covering the printed circuits 12b.

(2) Electromagnetic Wave Shielding Film Arrangement Step

Next, as shown in FIG. 5A, the electromagnetic wave shielding film 20a is prepared which sequentially includes the conductive adhesive layer 21a, the shielding layer 22a, and the insulating layer 23a that are laminated.

Then, as shown in FIG. 5B, the electromagnetic wave shielding film 20a is laminated on the substrate film 10 in such a manner that the conductive adhesive layer 21a of the electromagnetic wave shielding film 20a is in contact with the ground circuit 12a of the substrate film 10.

(3) Connecting Member Arrangement Step

Next, as shown in FIG. 6A, the conductive filler 31 is fixed to the metal foil 33 with the adhesive resin 32 in such a manner that the conductive filler 31 is partially exposed, whereby the connecting member 30 including the metal foil 33 and the conductive filler 31 fixed to the metal foil 33 with the adhesive resin 32 is prepared.

Then, as shown in FIG. 6B, the connecting member 30 is arranged on the electromagnetic wave shielding film 20a by pressing the connecting member 30 against the electromagnetic wave shielding film 20a in such a manner that the conductive filler 31 of the connecting member 30 penetrates the insulating layer 23a of the electromagnetic wave shielding film 20a and is in contact with the shielding layer 22a of the electromagnetic wave shielding film 20a.

(4) Reinforcing Member Arrangement Step

Next, as shown in FIG. 7A, the reinforcing member 40 including the conductive adhesive layer 41 and the metal reinforcing plate 42 is prepared.

Then, as shown in FIG. 7B, the reinforcing member 40 is arranged in such a manner that the conductive adhesive layer 41 of the reinforcing member 40 is in contact with the insulating layer 23a of the electromagnetic wave shielding film 20a and the metal foil 33 of the connecting member 30.

The shielded printed wiring board 1a can be produced by the above steps.

In the method of producing the shielded printed wiring board 1a, as shown in FIG. 5A and FIG. 5B, the insulating layer 23a of the electromagnetic wave shielding film 20a includes no depressions or projections. Yet, in the method of producing the shielded printed wiring board according to the first embodiment of the present invention, the insulating layer of the electromagnetic wave shielding film may include at least one of a projection or a depression, and in the connecting member arrangement step, the connecting member may be arranged across a boundary of the at least one of a projection or a depression of the insulating layer of the electromagnetic wave shielding film.

The metal foil of the connecting member is flexible and can easily change its shape. Thus, even when the insulating layer of the electromagnetic wave shielding film includes at least one of a depression or a projection, the metal foil can change its shape according to the shape of the at least one of a depression or a projection.

Thus, even when the insulating layer of the electromagnetic wave shielding film includes at least one of a depression or a projection, the conductive filler of the connecting member can sufficiently penetrate the insulating layer of the electromagnetic wave shielding film.

The connecting member 30, which is used in the method of producing the shielded printed wiring board 1a, is the connecting member of the present invention.

In the connecting member 30, the conductive filler 31 is fixed to the metal foil 33 with the adhesive resin 32 in such a manner that the conductive filler 31 is partially exposed. Yet, in the connecting member of the present invention, the conductive filler may be fixed to the metal foil in such a manner that the conductive filler is entirely covered by the adhesive resin.

Use of such a connecting member in the production of a shielded printed wiring board makes it possible to produce a shielded printed wiring board in which the ground circuit of the substrate film is sufficiently electrically connected to the metal reinforcing plate of the reinforcing member.

The following describes another shielded printed wiring board according to the first embodiment of the present invention.

Figure 8:
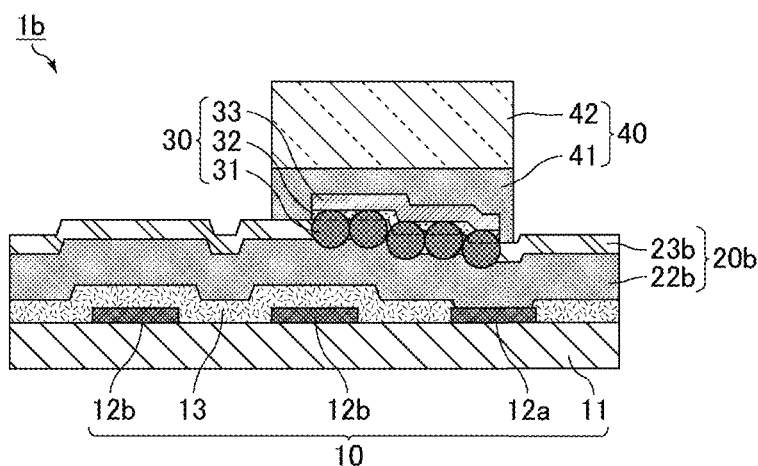
FIG. 8 is an exemplary schematic cross-sectional view of another shielded printed wiring board according to the first embodiment of the present invention.

FIG. 8 is an exemplary schematic cross-sectional view of another shielded printed wiring board according to the first embodiment of the present invention.

Another shielded printed wiring board 1b according to the first embodiment of the present invention has the same structure as that of the shielded printed wiring board 1a, except that the electromagnetic wave shielding film 20a of the shielded printed wiring board 1a is replaced by an electromagnetic wave shielding film 20b sequentially including a shielding layer 22b made of a conductive adhesive and an insulating layer 23b that are laminated.

Specifically, as shown in FIG. 8, the shielded printed wiring board 1b includes the followings: the substrate film 10 including the base film 11, and the ground circuit 12a and the other printed circuits 12b formed on the base film 11; the electromagnetic wave shielding film 20b sequentially including the shielding layer 22b made of a conductive adhesive and the insulating layer 23b that are laminated; the connecting member 30 including the metal foil 33 and the conductive filler 31 fixed to the metal foil 33 with the adhesive resin 32; and the reinforcing member 40 including the conductive adhesive layer 41 and the metal reinforcing plate 42.

In the shielded printed wiring board 1b, the printed circuits 12b of the substrate film 10 are covered by the coverlay 13, and the ground circuit 12a of the substrate film 10 is not covered by the coverlay 13.

In the shielded printed wiring board 1b, the electromagnetic wave shielding film 20b is arranged on the substrate film 10 in such a manner that the shielding layer 22b of the electromagnetic wave shielding film 20b is in contact with the ground circuit 12a of the substrate film 10.

In the shielded printed wiring board 1b, the printed circuits 12b of the substrate film 10 are covered by the coverlay 13, so that the printed circuits 12b are not in contact with the shielding layer 22b of the electromagnetic wave shielding film 20b.

In the shielded printed wiring board 1b, the connecting member 30 is arranged on the electromagnetic wave shielding film 20b in such a manner that the conductive filler 31 of the connecting member 30 penetrates the insulating layer 23b of the electromagnetic wave shielding film 20b and that the conductive filler 31 of the connecting member 30 is in contact with the shielding layer 22b of the electromagnetic wave shielding film 20b.

In the shielded printed wiring board 1b, the reinforcing member 40 is arranged on the electromagnetic wave shielding film 20b and the connecting member 30 in such a manner that the conductive adhesive layer 41 of the reinforcing member 40 is in contact with the insulating layer 23b of the electromagnetic wave shielding film 20b and the metal foil 33 of the connecting member 30.

Further, in the shielded printed wiring board 1b, the ground circuit 12a of the substrate film 10 is electrically connected to the metal reinforcing plate 42 of the reinforcing member 40.

The shielded printed wiring board 1b achieves the same effects as those of the shielded printed wiring board 1a, although the structure of the electromagnetic wave shielding film is different.

The following describes a structure of the electromagnetic wave shielding film 20b of the shielded printed wiring board 1b.

In the electromagnetic wave shielding film 20b, the shielding layer 22b may be made of any material as long as it is made of a conductive adhesive and has an electromagnetic wave shielding function.

For example, the shielding layer 22b may be made of conductive particles and an adhesive resin composition.

The conductive particles are not limited, but may be fine metal particles, carbon nanotubes, carbon fibers, metal fibers, or the like.

When the conductive particles are fine metal particles, the fine metal particles are not limited. Examples include silver powder, copper powder, nickel powder, solder powder, aluminum powder, silver-coated copper powder (silver-plated copper powder), and fine particles (such as polymer fine particles and glass beads) coated with metal.

Of these, a copper powder or a silver-coated copper powder, each of which is available at a lower cost, is preferred in terms of economic efficiency.

The average particle size of the conductive particles is not limited, but it is preferably 0.5 to 15.0 μm. Conductive particles having an average particle size of 0.5 μm or more result in a conductive adhesive layer having good conductivity. Conductive particles having an average particle size of 15.0 μm or less can provide a thin conductive adhesive layer.

The shape of the conductive particles is not limited, and it can be suitably selected from spherical, flat, scaly, dendrite, rod, fibrous, and other like shapes.

The material of the adhesive resin composition is not limited. Examples include styrene resin compositions, vinyl acetate resin compositions, polyester resin compositions, polyethylene resin compositions, polypropylene resin compositions, imide resin compositions, amide resin compositions, acrylic resin compositions, and other like thermoplastic resin compositions; and phenolic resin compositions, epoxy resin compositions, urethane resin compositions, melamine resin compositions, alkyd resin compositions, and other like thermosetting resin compositions.

The material of the adhesive resin composition may include only one of these materials or two or more thereof in combination.

The shielding layer 22b may contain additives such as curing accelerators, tackifiers, antioxidants, pigments, dyes, plasticizers, UV absorbers, defoamers, leveling agents, fillers, flame retardants, or viscosity modifiers, as needed.

The amount of conductive particles in the shielding layer 22b is not limited, but it is preferably 15 to 80 mass %, more preferably 15 to 60 mass %.

The conductive particles in an amount in the above ranges improve the adhesiveness.

The thickness of the shielding layer 22b is not limited, and it can be suitably set as needed, but it is preferably 0.5 to 20.0 μm.

A shielding layer having a thickness of less than 0.5 μm is less likely to provide a good electromagnetic wave shielding function.

A shielding layer having a thickness of more than 20.0 μm results in a shielded printed wiring board that is entirely thick and difficult to handle.

In the electromagnetic wave shielding film 20b, the insulating layer 23b is not limited as long as it has sufficient insulation and is capable of protecting the shielding layer 22b. For example, preferably, the insulating layer 23b is made of a thermoplastic resin composition, a thermosetting resin composition, an active energy ray-curable composition, or the like.

The thermoplastic resin composition is not limited. Examples include styrene resin compositions, vinyl acetate resin compositions, polyester resin compositions, polyethylene resin compositions, polypropylene resin compositions, imide resin compositions, and acrylic resin compositions.

The thermosetting resin composition is not limited. Examples include phenolic resin compositions, epoxy resin compositions, urethane resin compositions, melamine resin compositions, and alkyd resin compositions.

The active energy ray-curable composition is not limited. Examples include polymerizable compounds having at least two (meth)acryloyloxy groups in the molecule.

The insulating layer 23b may be made of a single material or two or more materials.

The insulating layer 23b may contain additives such as curing accelerators, tackifiers, antioxidants, pigments, dyes, plasticizers, UV absorbers, defoamers, leveling agents, fillers, flame retardants, viscosity modifiers, or anti-blocking agents, as needed.

The thickness of the insulating layer 23b is not limited, and it can be suitably set as needed, but it is preferably 1 to 15 μm, more preferably 3 to 10 μm.

An insulating layer having a thickness of less than 1 μm is too thin to sufficiently protect the conductive adhesive layer and the shielding layer.

An insulating layer having a thickness of more than 15 μm is too thick to allow the electromagnetic wave shielding film to be easily bent, and is easily breakable. Thus, such an insulating layer is less applicable to a member that requires bending resistance.

The electromagnetic wave shielding film 20b may include an anchor coat layer between the shielding layer 22b and the insulating layer 23b.

Examples of a material of the anchor coat layer include a urethane resin, an acrylic resin, core-shell composite resins containing a urethane resin as a shell and an acrylic resin as a core, an epoxy resin, an imide resin, an amide resin, a melamine resin, a phenolic resin, a urea formaldehyde resin, blocked isocyanates obtained by reacting a polyisocyanate with a blocking agent such as phenol, polyvinyl alcohol, and polyvinylpyrrolidone.

Preferred structures, materials, and the like of the substrate film 10 and the reinforcing member 40 of the shielded printed wiring board 1b are the same as those of the substrate film 10 and the reinforcing member 40 of the shielded printed wiring board 1a.

Regarding the method of producing the shielded printed wiring board 1b, in the electromagnetic wave shielding film arrangement step (2) of the method of producing the shielded printed wiring board 1a, the electromagnetic wave shielding film 20a may be replaced by the electromagnetic wave shielding film 20b sequentially including the shielding layer 22b made of a conductive adhesive and the insulating layer 23b that are laminated.

In the shielded printed wiring board 1b shown in FIG. 8, the insulating layer 23b of the electromagnetic wave shielding film 20b includes projections and a depression attributable to the printed circuits 12b and the ground circuit 12a, respectively. However, in each of the shielded printed wiring boards of the present invention, the insulating layer of the electromagnetic wave shielding film may be flat without depressions and projections.

The following describes another shielded printed wiring board according to the first embodiment of the present invention.

Figure 9:
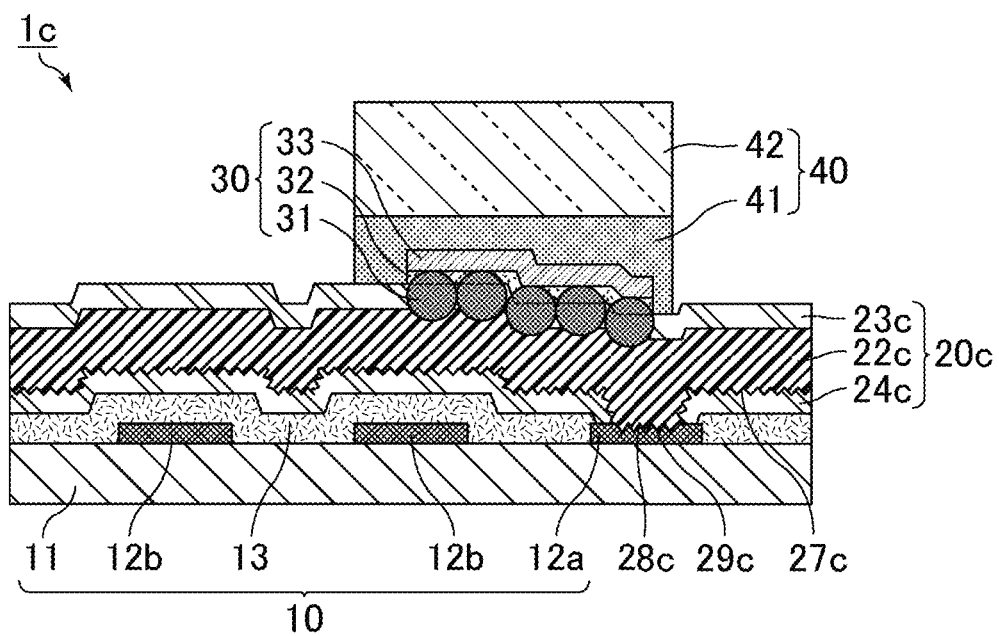
FIG. 9 is an exemplary schematic cross-sectional view of yet another shielded printed wiring board according to the first embodiment of the present invention.

FIG. 9 is an exemplary schematic cross-sectional view of another shielded printed wiring board according to the first embodiment of the present invention.

Another shielded printed wiring board 1c according to the first embodiment of the present invention has the same structure as that of the shielded printed wiring board 1a, except that the electromagnetic wave shielding film 20a of the shielded printed wiring board 1a is replaced by an electromagnetic wave shielding film 20c sequentially including the insulating adhesive layer 24c, a shielding layer 22c made of metal, and an insulating layer 23c that are laminated.

Specifically, as shown in FIG. 9, the shielded printed wiring board 1c includes the followings: the substrate film 10 including the base film 11, and the ground circuit 12a and the other printed circuits 12b formed on the base film 11; the electromagnetic wave shielding film 20c sequentially including an insulating adhesive layer 24c, the shielding layer 22c made of metal, and the insulating layer 23c that are laminated; the connecting member 30 including the metal foil 33 and the conductive filler 31 fixed to the metal foil 33 with the adhesive resin 32; and the reinforcing member 40 including the conductive adhesive layer 41 and the metal reinforcing plate 42.

The shielding layer 22c has a roughened surface 27c adjacent to the insulating adhesive layer 24c, and the roughened surface 27c includes depressions 28c and projections 29c.

In the shielded printed wiring board 1c, the printed circuits 12b of the substrate film 10 are covered by the coverlay 13, and the ground circuit 12a of the substrate film 10 is not covered by the coverlay 13.

In the shielded printed wiring board 1c, the electromagnetic wave shielding film 20c is arranged on the substrate film 10 in such a manner that the projections 29c, which are a part of the shielding layer 22c, penetrate the insulating adhesive layer 24c and are in contact with the ground circuit 12a of the substrate film 10.

In the shielded printed wiring board 1c, the printed circuits 12b of the substrate film 10 are covered by the coverlay 13, so that the printed circuits 12b are not in contact with the shielding layer 22c of the electromagnetic wave shielding film 20c.

In the shielded printed wiring board 1c, the connecting member 30 is arranged on the electromagnetic wave shielding film 20c in such a manner that the conductive filler 31 of the connecting member 30 penetrates the insulating layer 23c of the electromagnetic wave shielding film 20c and that the conductive filler 31 of the connecting member 30 is in contact with the shielding layer 22c of the electromagnetic wave shielding film 20c.

In the shielded printed wiring board 1c, the reinforcing member 40 is arranged on the electromagnetic wave shielding film 20c and the connecting member 30 in such a manner that the conductive adhesive layer 41 of the reinforcing member 40 is in contact with the insulating layer 23c of the electromagnetic wave shielding film 20c and the metal foil 33 of the connecting member 30.

Further, in the shielded printed wiring board 1c, the ground circuit 12a of the substrate film 10 is electrically connected to the metal reinforcing plate 42 of the reinforcing member 40.

The shielded printed wiring board 1c achieves the same effects as those of the shielded printed wiring board 1a, although the structure of the electromagnetic wave shielding film is different.

The following describes a structure of the electromagnetic wave shielding film 20c of the shielded printed wiring board 1c.

In the electromagnetic wave shielding film 20c, the insulating adhesive layer 24c may be made of any material. Examples include styrene resin compositions, vinyl acetate resin compositions, polyester resin compositions, polyethylene resin compositions, polypropylene resin compositions, imide resin compositions, amide resin compositions, acrylic resin compositions, and other like thermoplastic resin compositions; and phenolic resin compositions, epoxy resin compositions, urethane resin compositions, melamine resin compositions, alkyd resin compositions, and other like thermosetting resin compositions.

The material of the insulating adhesive layer 24c may include only one of these materials or two or more thereof in combination.

The insulating adhesive layer 24c may contain additives such as curing accelerators, tackifiers, antioxidants, pigments, dyes, plasticizers, UV absorbers, defoamers, leveling agents, fillers, flame retardants, or viscosity modifiers, as needed.

The thickness of the insulating adhesive layer 24c is not limited, but it is preferably 0.5 to 20.0 µm, more preferably 1 to 15 µm.

An insulating adhesive layer having a thickness of less than 0.5 µm has low strength and is easily breakable.

An insulating adhesive layer having a thickness of more than 20.0 µm results in a shielding layer that cannot easily penetrate the insulating adhesive layer.

In the electromagnetic wave shielding film 20c, the shielding layer 22c is made of metal.

The shielding layer 22c may include a layer made of a material such as gold, silver, copper, aluminum, nickel, tin, palladium, chromium, titanium, zinc, or the like, and preferably includes a copper layer.

Copper is a material suitable for the shielding layer 22c in terms of conductivity and economic efficiency.

The shielding layer 22c may include a layer made of an alloy of the metals described above.

In the electromagnetic wave shielding film 20c, the shielding layer 22c has the roughened surface 27c adjacent to the insulating adhesive layer 24c. The surface roughness Ra is preferably 0.5 to 30 µm, more preferably 0.5 to 20 µm.

A shielding layer having a surface roughness Ra of less than 0.5 µm has projections that cannot easily penetrate the insulating adhesive layer.

A shielding layer having a surface roughness Ra of more than 30 µm is rougher than necessary, and it is costly to form such a shielding layer.

In the electromagnetic wave shielding film 20c, the insulating layer 23c is not limited as long as it has sufficient insulation and is capable of protecting the insulating adhesive layer 24c and the shielding layer 22c. For example, preferably, the insulating layer 23c is made of a thermoplastic resin composition, a thermosetting resin composition, an active energy ray-curable composition, or the like.

The thermoplastic resin composition is not limited. Examples include styrene resin compositions, vinyl acetate resin compositions, polyester resin compositions, polyethylene resin compositions, polypropylene resin compositions, imide resin compositions, and acrylic resin compositions.

The thermosetting resin composition is not limited. Examples include phenolic resin compositions, epoxy resin compositions, urethane resin compositions, melamine resin compositions, and alkyd resin compositions.

The active energy ray-curable composition is not limited. Examples include polymerizable compounds having at least two (meth)acryloyloxy groups in the molecule.

The insulating layer 23c may be made of a single material or two or more materials.

The insulating layer 23c may contain additives such as curing accelerators, tackifiers, antioxidants, pigments, dyes, plasticizers, UV absorbers, defoamers, leveling agents, fillers, flame retardants, viscosity modifiers, or anti-blocking agents, as needed.

The thickness of the insulating layer 23c is not limited, and it can be suitably set as needed, but it is preferably 1 to 15 μm, more preferably 3 to 10 μm. An insulating layer having a thickness of less than 1 μm is too thin to sufficiently protect the insulating adhesive layer and the shielding layer. An insulating layer having a thickness of more than 15 μm is too thick to allow the electromagnetic wave shielding film to be easily bent, and is easily breakable. Thus, such an insulating layer is less applicable to a member that requires bending resistance.

An insulating layer having a thickness of more than 15 μm is too thick to allow the electromagnetic wave shielding film to be easily bent, and is easily breakable. Thus, such an insulating layer is less applicable to a member that requires bending resistance.

The electromagnetic wave shielding film 20c may include an anchor coat layer between the shielding layer 22c and the insulating layer 23c.

Examples of a material of the anchor coat layer include a urethane resin, an acrylic resin, core-shell composite resins containing a urethane resin as a shell and an acrylic resin as a core, an epoxy resin, an imide resin, an amide resin, a melamine resin, a phenolic resin, a urea formaldehyde resin, blocked isocyanates obtained by reacting a polyisocyanate with a blocking agent such as phenol, polyvinyl alcohol, and polyvinylpyrrolidone.

Preferred structures, materials, and the like of the substrate film 10 and the reinforcing member 40 of the shielded printed wiring board 1c are the same as those of the substrate film 10 and the reinforcing member 40 of the shielded printed wiring board 1a.

Regarding the method of producing the shielded printed wiring board 1c, in the electromagnetic wave shielding film arrangement step (2) of the method of producing the shielded printed wiring board 1a, the electromagnetic wave shielding film 20a may be replaced by the electromagnetic wave shielding film 20c sequentially including the insulating adhesive layer 24c, the shielding layer 22c made of metal, and the insulating layer 23c that are laminated.

The projections 29c of the shielding layer 22c may not necessarily be penetrating the insulating adhesive layer 24c during the preparation of the electromagnetic wave shielding film 20c. In this case, pressure may be applied when laminating the electromagnetic wave shielding film 20c on the substrate film 10 in such a manner that the projections 29c of the shielding layer 22c of the electromagnetic wave shielding film 20c penetrate the insulating adhesive layer 24c and are in contact with the ground circuit 12a of the substrate film 10.

In the shielded printed wiring board 1c shown in FIG. 9, the insulating layer 23b of the electromagnetic wave shielding film 20c includes projections and a depression attributable to the printed circuits 12b and the ground circuit 12a, respectively. However, in each of the shielded printed wiring boards of the present invention, the insulating layer of the electromagnetic wave shielding film may be flat without depressions and projections.

Second Embodiment

The following describes a shielded printed wiring board according to a second embodiment of the present invention.

Figure 10:
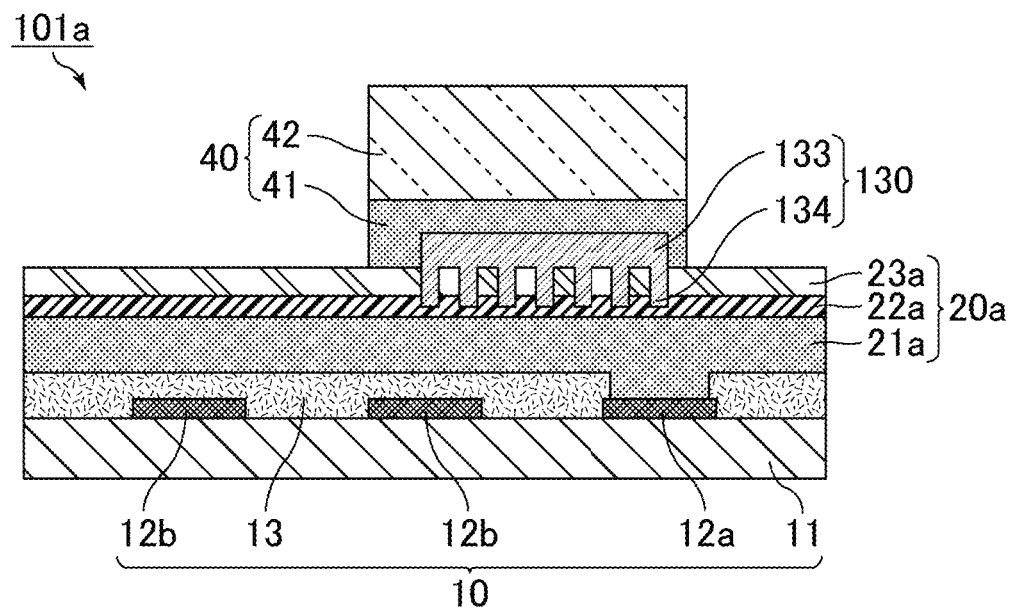
FIG. 10 is an exemplary schematic cross-sectional view of a shielded printed wiring board according to a second embodiment of the present invention.

FIG. 10 is an exemplary schematic cross-sectional view of the shielded printed wiring board according to the second embodiment of the present invention.

The shielded printed wiring board 101a according to the second embodiment of the present invention has the same structure as that of the shielded printed wiring board 1a, except that the connecting member 30 of the shielded printed wiring board 1a is replaced by a connecting member 130 including a metal foil 133 and conductive protrusions 134 formed on the metal foil 133.

Specifically, as shown in FIG. 10, the shielded printed wiring board 101a includes the followings: the substrate film 10 including the base film 11, and the ground circuit 12a and the other printed circuits 12b formed on the base film 11; the electromagnetic wave shielding film 20a sequentially including the conductive adhesive layer 21a, the shielding layer 22a, and the insulating layer 23a that are laminated; the connecting member 130 including the metal foil 133 and the conductive protrusions 134 formed on the metal foil 133; and the reinforcing member 40 including the conductive adhesive layer 41 and the metal reinforcing plate 42.

In the shielded printed wiring board 101a, the connecting member 130 is arranged on the electromagnetic wave shielding film 20a in such a manner that the conductive protrusions 134 of the connecting member 130 penetrates the insulating layer 23a of the electromagnetic wave shielding film 20a and is in contact with the shielding layer 22a of the electromagnetic wave shielding film 20a.

In the shielded printed wiring board 101a, the reinforcing member 40 is arranged on the electromagnetic wave shielding film 20a and the connecting member 130 in such a manner that the conductive adhesive layer 41 of the reinforcing member 40 is in contact with the insulating layer 23a of the electromagnetic wave shielding film 20a and the metal foil 133 of the connecting member 130.

The use of the connecting member 130 in the shielded printed wiring board 101a as described above allows the conductive protrusions 134 of the connecting member 130 to be sufficiently in contact with the shielding layer 22a of the electromagnetic wave shielding film 20a. This results in a low the electrical resistance value between the electromagnetic wave shielding film 20a and the connecting member 130.

As a result, in the shielded printed wiring board 101a, the ground circuit 12a of the substrate film 10 is sufficiently electrically connected to the metal reinforcing plate 42 of the reinforcing member 40.

The shielded printed wiring board according to the second embodiment of the present invention may be configured as follows: the insulating layer of the electromagnetic wave shielding film includes at least one of a projection or a depression, and the connecting member is arranged across a boundary of the at least one of a projection or a depression of the insulating layer of the electromagnetic wave shielding film.

The following describes, with reference to the drawing, the shielded printed wiring board according to the second embodiment of the present invention in which the insulating layer of the electromagnetic wave shielding film includes at least one of a depression or a projection.

Figure 11:
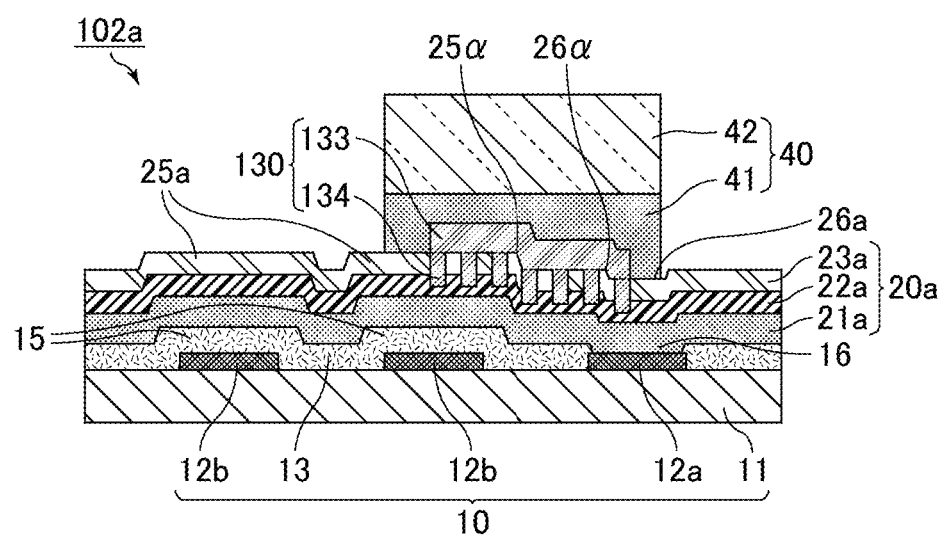
FIG. 11 is another exemplary schematic cross-sectional view of the shielded printed wiring board according to the second embodiment of the present invention.

FIG. 11 is another exemplary schematic cross-sectional view of the shielded printed wiring board according to the second embodiment of the present invention.

As shown in FIG. 11, a shielded printed wiring board 102a includes the substrate film 10, the electromagnetic wave shielding film 20a, the connecting member 130, and the reinforcing member 40, as is the case with the shielded printed wiring board 101a.

In the shielded printed wiring board 102a, the printed circuits 12b of the substrate film 10 are covered by the coverlay 13, and the ground circuit 12a of the substrate film 10 is not covered by the coverlay 13.

The substrate film 10 includes the projections 15 at portions corresponding to the printed circuits 12b covered by the coverlay 13. The substrate film 10 includes the depression 16 at a portion corresponding to the ground circuit 12a because the ground circuit 12a is not covered by the coverlay 13.

In the shielded printed wiring board 102a, the electromagnetic wave shielding film 20a is arranged on the substrate film 10 in such a manner that the conductive adhesive layer 21a of the electromagnetic wave shielding film 20a is in contact with the ground circuit 12a.

In the shielded printed wiring board 102a, the insulating layer 23a of the electromagnetic wave shielding film 20a includes the depression 26a and the projections 25a attributable to the depression 16 and the projections 15, respectively, of the substrate film 10.

In the shielded printed wiring board 102a, the connecting member 130 is arranged on the electromagnetic wave shielding film 20a in such a manner that the conductive protrusions 134 of the connecting member 130 penetrates the insulating layer 23a of the electromagnetic wave shielding film 20a and that the conductive protrusions 134 of the connecting member 130 is in contact with the shielding layer 22a of the electromagnetic wave shielding film 20a.

In the shielded printed wiring board 102a, the connecting member 130 is arranged across the boundary 26a of the depression 26a and the boundary 25a of the projection 25a of the insulating layer 23a of the electromagnetic wave shielding film 20a.

In the shielded printed wiring board 102a, the reinforcing member 40 is arranged on the electromagnetic wave shielding film 20a and the connecting member 130 in such a manner that the conductive adhesive layer 41 of the reinforcing member 40 is in contact with the insulating layer 23a of the electromagnetic wave shielding film 20a and the metal foil 133 of the connecting member 130.

Here, the metal foil 133 of the connecting member 130 is flexible and can easily change its shape. Thus, even when the insulating layer 23a of the electromagnetic wave shielding film 20a includes the depression 26a and the projections 25a, the metal foil 133 of the connecting member 130 can change its shape according to the shapes of the depression 26a and the projections 25a.

Thus, even when the insulating layer 23a of the electromagnetic wave shielding film 20a includes the depression 26a and the projections 25a, the conductive protrusions 134 of the connecting member 130 can sufficiently penetrate the insulating layer 23a of the electromagnetic wave shielding film 20a.

Thus, in the shielded printed wiring board 102a, the ground circuit 12a of the substrate film 10 is sufficiently electrically connected to the metal reinforcing plate 42 of the reinforcing member 40.

The following describes each structure of the shielded printed wiring board 101a.
(Connecting Member)

In the connecting member 130, the conductive protrusions 134 may be integrated with the metal foil 133 or may be adhered to the metal foil 133 with an adhesive resin.

In the connecting member 130, the metal foil 133 is not limited as long as it is a conductive metal. For example, preferably, the metal foil 133 includes at least one selected from the group consisting of copper, aluminum, silver, gold, nickel, chromium, titanium, zinc, and stainless steel.

These materials have excellent conductivity.

In the connecting member 130, the thickness of the metal foil 133 is preferably 0.1 µm or more, more preferably 1 µm or more.

A metal foil having a thickness of less than 0.1 µm has low strength and is easily breakable.

When the electromagnetic wave shielding film 20a includes at least one of a depression or a projection, preferably, the thickness of the metal foil 133 of the connecting member 130 is less than or equal to the distance corresponding to the depth of the depression or the height of the projection, whichever is greater. More preferably, the thickness is less than or equal to 50% of the distance corresponding to the depth of the depression or the height of the projection, whichever is greater.

When the thickness of the metal foil is more than the distance corresponding to the height of the projection or the depth of the projection of the insulating layer of the electromagnetic wave shielding film, whichever is greater, the metal foil reduces its flexibility and cannot easily change its shape according to the shape of the depression and/or projection of the insulating layer of the electromagnetic wave shielding film.

In the connecting member 130, the material of the conductive protrusions 134 is not limited. For example, preferably, the material includes at least one selected from the group consisting of copper, aluminum, silver, gold, nickel, chromium, titanium, zinc, and stainless steel.

Preferably, the metal foil 133 and the conductive protrusions 134 are made of the same material.

In the connecting member 130, the conductive protrusions 134 may have a columnar shape. For example, the shape may be a cylinder, elliptical prism, triangular prism, quadrangular prism, pentagonal prism, hexagonal column, octagonal pillar, or the like.

The conductive protrusions 134 having a columnar shape can easily penetrate the insulating layer 23a of the electromagnetic wave shielding film 20a.

In the connecting member 130, the bottom area of each conductive protrusion 134 is preferably 1.0 to $1.0 \times 10^6$ µm$^2$.

A conductive protrusion having a bottom area of less than 1.0 µm$^2$ has low strength and is easily bendable.

A conductive protrusion having a bottom area of more than $1.0 \times 10^6$ µm$^2$ is too thick and thus cannot easily penetrate the insulating layer of the electromagnetic wave shielding film.

In the connecting member 130, the pitch of the conductive protrusions 134 is preferably 1 to 1000 µm.

A connecting member including conductive protrusions having a pitch of less than 1 µm is technically difficult to produce.

Conductive protrusions having a pitch of more than 1000 µm are low in density, reducing the total contact area between the conductive protrusions of the connecting member and the shielding layer of the electromagnetic wave shielding film. Thus, the electrical resistance can be easily increased.

In the connecting member 130, the height of each conductive protrusion 134 is not limited as long as the conductive protrusions 134 can penetrate the insulating layer 23*a* of the electromagnetic wave shielding film 20*a*, but the height is preferably 1 to 60 μm.

Preferred structures, materials, and the like of the substrate film 10, the electromagnetic wave shielding film 20*a*, and the reinforcing member 40 of the shielded printed wiring board 101*a* are the same as those of the substrate film 10, the electromagnetic wave shielding film 20*a*, and the reinforcing member 40 of the shielded printed wiring board 1*a*.

The following describes a method of producing the shielded printed wiring board 101*a*.

This method of producing the shielded printed wiring board is an exemplary method of producing the shielded printed wiring board according to the second embodiment of the present invention.

The method of producing the shielded printed wiring board 101*a* may include a substrate film preparation step (1), an electromagnetic wave shielding film arrangement step (2), a connecting member arrangement step (3), and a reinforcing member arrangement step (4).

The following specifically describes each step with reference to the drawings.

Figure 12:
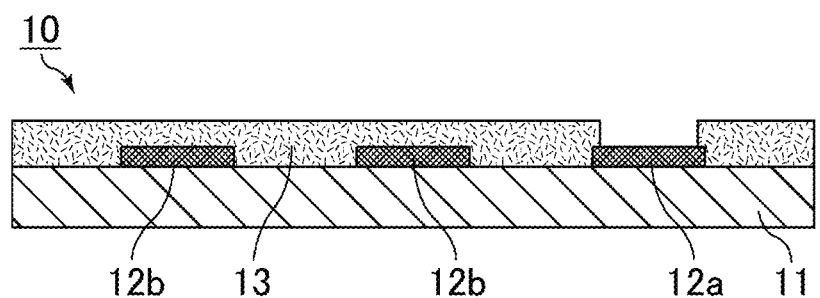
FIG. 12 is a schematic view of an exemplary substrate film preparation step according to the second embodiment of the present invention.

FIG. 12 is a schematic view of an exemplary substrate film preparation step according to the second embodiment of the present invention.

Figure 13A:
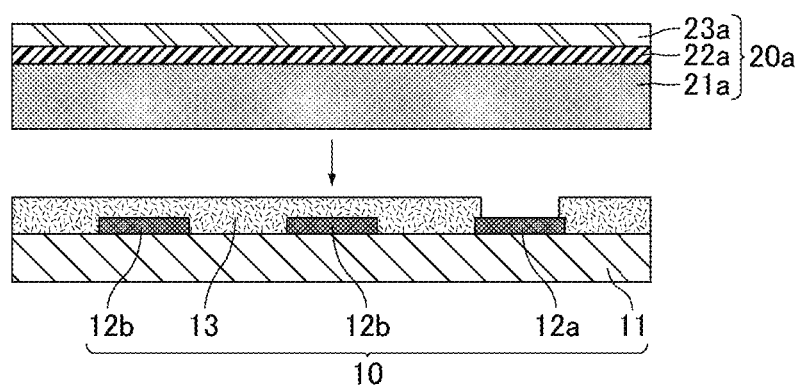
FIG. 13A is a schematic view of an exemplary electromagnetic wave shielding film arrangement step according to the second embodiment of the present invention.
Figure 13B:
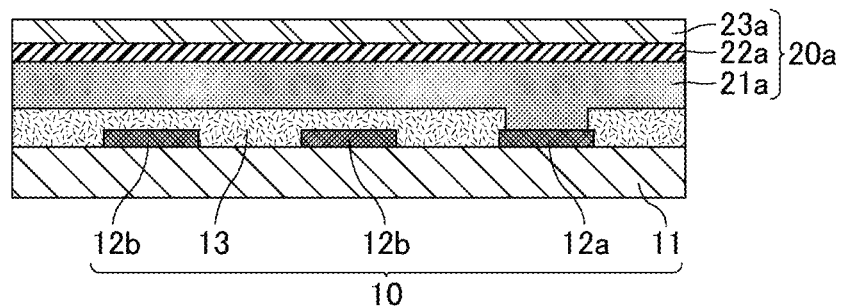
FIG. 13B is a schematic view of an exemplary electromagnetic wave shielding film arrangement step according to the second embodiment of the present invention.

FIG. 13A and FIG. 13B are schematic views of an exemplary electromagnetic wave shielding film arrangement step according to the second embodiment of the present invention.

Figure 14A:
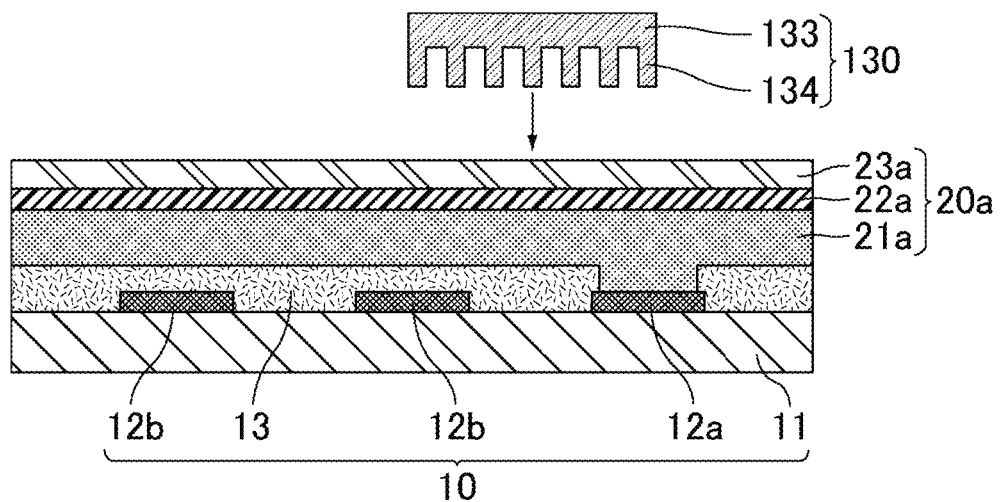
FIG. 14A is a schematic view of an exemplary connecting member arrangement step according to the second embodiment of the present invention.
Figure 14B:
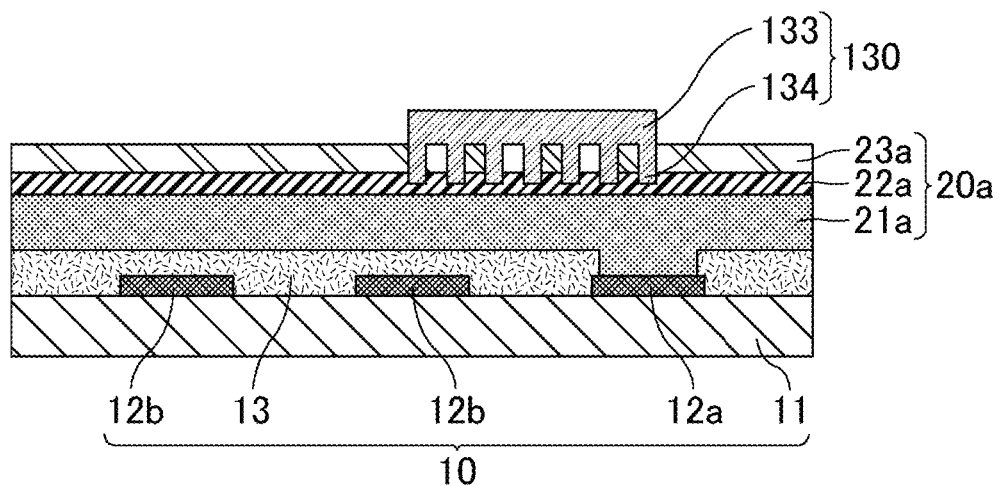
FIG. 14B is a schematic view of an exemplary connecting member arrangement step according to the second embodiment of the present invention.

FIG. 14A and FIG. 14B are schematic views of an exemplary connecting member arrangement step according to the second embodiment of the present invention.

Figure 15A:
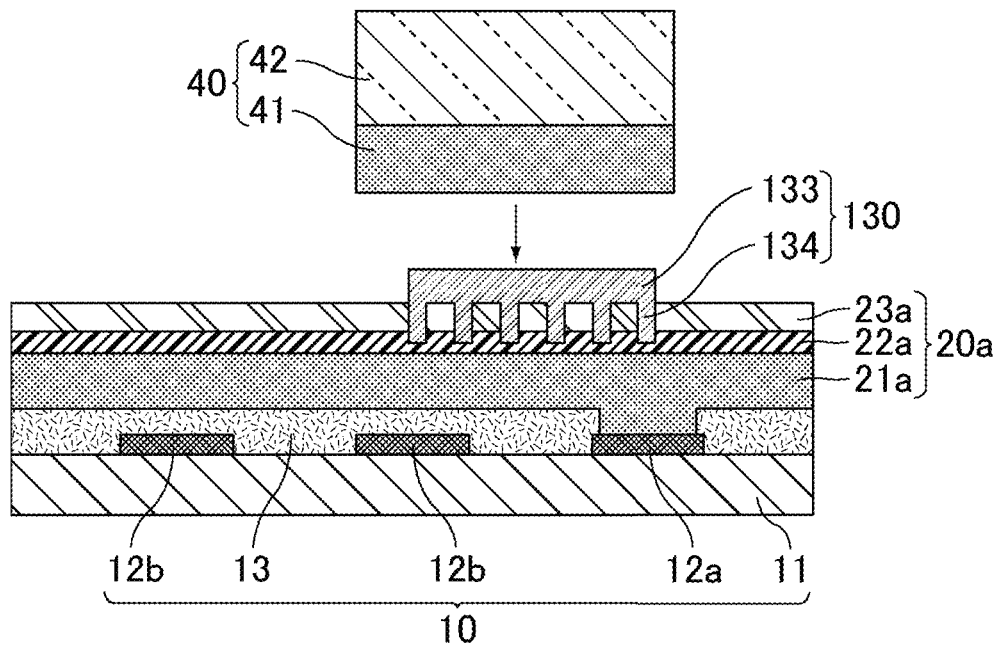
FIG. 15A is a schematic view of an exemplary reinforcing member arrangement step according to the second embodiment of the present invention.
Figure 15B:
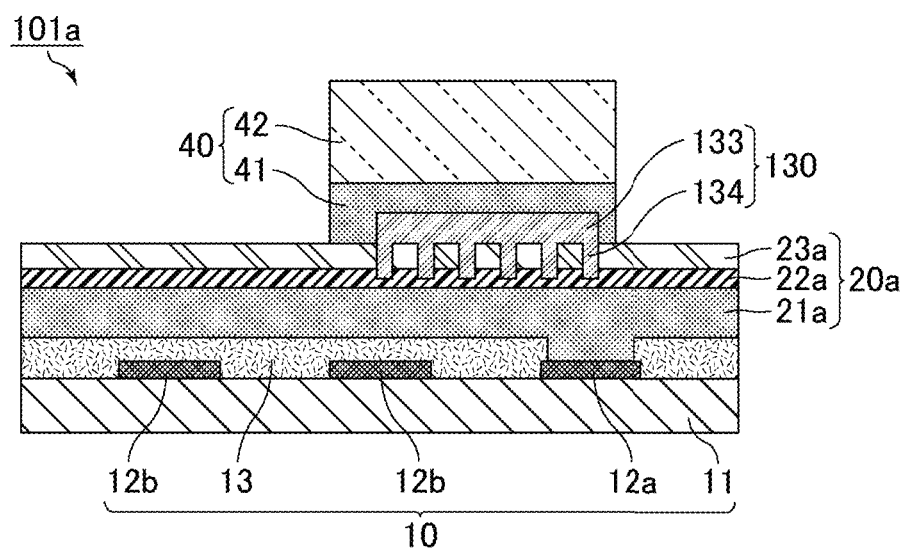
FIG. 15B is a schematic view of an exemplary reinforcing member arrangement step according to the second embodiment of the present invention.

FIG. 15A and FIG. 15B are schematic views of an exemplary reinforcing member arrangement step according to the second embodiment of the present invention.

(1) Substrate Film Preparation Step

First, as shown in FIG. 12, the substrate film 10 is prepared which includes the base film 11, the ground circuit 12*a* and the other printed circuits 12*b* formed on the base film 11, and the coverlay 13 covering the printed circuits 12*b*.

(2) Electromagnetic Wave Shielding Film Arrangement Step

Next, as shown in FIG. 13A, the electromagnetic wave shielding film 20*a* is prepared which sequentially includes the conductive adhesive layer 21*a*, the shielding layer 22*a*, and the insulating layer 23*a* that are laminated.

Then, as shown in FIG. 13B, the electromagnetic wave shielding film 20*a* is laminated on the substrate film 10 in such a manner that the conductive adhesive layer 21*a* of the electromagnetic wave shielding film 20*a* is in contact with the ground circuit 12*a* of the substrate film 10.

(3) Connecting Member Arrangement Step

Next, as shown in FIG. 14A, the connecting member 130 including the metal foil 133 and the conductive protrusions 134 formed on the metal foil 133 is prepared.

Then, as shown in FIG. 14B, the connecting member 130 is arranged on the electromagnetic wave shielding film 20*a* by pressing the connecting member 130 against the electromagnetic wave shielding film 20*a* in such a manner that the conductive protrusions 134 of the connecting member 130 penetrates the insulating layer 23*a* of the electromagnetic wave shielding film 20*a* and is in contact with the shielding layer 22*a* of the electromagnetic wave shielding film 20*a*.

(4) Reinforcing Member Arrangement Step

Next, as shown in FIG. 15A, the reinforcing member 40 including the conductive adhesive layer 41 and the metal reinforcing plate 42 is prepared.

Then, as shown in FIG. 15B, the reinforcing member 40 is arranged in such a manner that the conductive adhesive layer 41 of the reinforcing member 40 is in contact with the insulating layer 23*a* of the electromagnetic wave shielding film 20*a* and the metal foil 133 of the connecting member 130.

The shielded printed wiring board 101*a* can be produced by the above steps.

In the method of producing the shielded printed wiring board 101*a*, as shown in FIG. 13A and FIG. 13B, the insulating layer 23*a* of the electromagnetic wave shielding film 20*a* includes no depressions or projections. Yet, in the method of producing the shielded printed wiring board according to the second embodiment of the present invention, the insulating layer of the electromagnetic wave shielding film may include at least one of a projection or a depression, and in the connecting member arrangement step, the connecting member may be arranged across a boundary of the at least one of a projection or a depression of the insulating layer of the electromagnetic wave shielding film.

The metal foil of the connecting member is flexible and can easily change its shape. Thus, even when the insulating layer of the electromagnetic wave shielding film includes at least one of a depression or a projection, the metal foil can change its shape according to the shape of the at least one of a depression or a projection.

Thus, even when the insulating layer of the electromagnetic wave shielding film includes at least one of a depression or a projection, the conductive protrusion of the connecting member can sufficiently penetrate the insulating layer of the electromagnetic wave shielding film.

The connecting member 130, which is used in the method of producing the shielded printed wiring board 101*a*, is the connecting member of the present invention.

Use of such a connecting member in the production of a shielded printed wiring board makes it possible to produce a shielded printed wiring board in which the ground circuit of the substrate film is sufficiently electrically connected to the metal reinforcing plate of the reinforcing member.

The following describes another shielded printed wiring board according to the second embodiment of the present invention.

Figure 16:
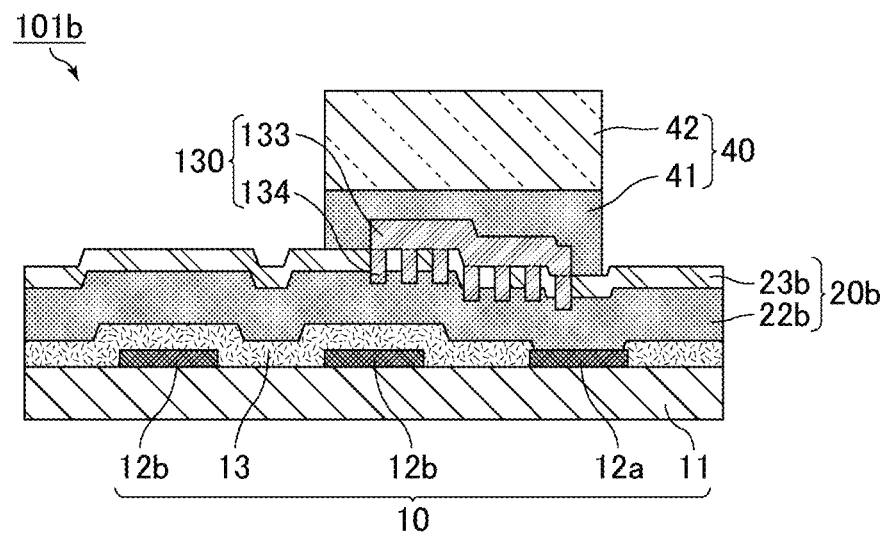
FIG. 16 is an exemplary schematic cross-sectional view of another shielded printed wiring board according to the second embodiment of the present invention.

FIG. 16 is an exemplary schematic cross-sectional view of another shielded printed wiring board according to the second embodiment of the present invention.

Another shielded printed wiring board 101*b* according to the second embodiment of the present invention has the same structure as that of the shielded printed wiring board 101*a*, except that the electromagnetic wave shielding film 20*a* of the shielded printed wiring board 101*a* is replaced by the electromagnetic wave shielding film 20*b* sequentially including the shielding layer 22*b* made of a conductive adhesive and the insulating layer 23*b* that are laminated.

Specifically, as shown in FIG. 16, the shielded printed wiring board 101*b* includes the followings: the substrate film 10 including the base film 11, and the ground circuit 12*a* and the other printed circuits 12*b* formed on the base film 11; the electromagnetic wave shielding film 20*b* sequentially including the shielding layer 22*b* made of a conductive adhesive and the insulating layer 23*b* that are laminated; the connecting member 130 including the metal foil 133 and the conductive protrusions 134 formed on the metal foil 133; and the reinforcing member 40 including the conductive adhesive layer 41 and the metal reinforcing plate 42.

In the shielded printed wiring board 101b, the printed circuits 12b of the substrate film 10 are covered by the coverlay 13, and the ground circuit 12a of the substrate film 10 is not covered by the coverlay 13.

In the shielded printed wiring board 101b, the electromagnetic wave shielding film 20b is arranged on the substrate film 10 in such a manner that the shielding layer 22b of the electromagnetic wave shielding film 20b is in contact with the ground circuit 12a of the substrate film 10.

In the shielded printed wiring board 101b, the printed circuits 12b of the substrate film 10 are covered by the coverlay 13, so that the printed circuits 12b are not in contact with the shielding layer 22b of the electromagnetic wave shielding film 20b.

In the shielded printed wiring board 101b, the connecting member 130 is arranged on the electromagnetic wave shielding film 20b in such a manner that the conductive protrusions 134 of the connecting member 130 penetrates the insulating layer 23b of the electromagnetic wave shielding film 20b and is in contact with the shielding layer 22b of the electromagnetic wave shielding film 20b.

In the shielded printed wiring board 101b, the reinforcing member 40 is arranged on the electromagnetic wave shielding film 20b and the connecting member 130 in such a manner that the conductive adhesive layer 41 of the reinforcing member 40 is in contact with the insulating layer 23b of the electromagnetic wave shielding film 20b and the metal foil 133 of the connecting member 130.

Further, in the shielded printed wiring board 101b, the ground circuit 12a of the substrate film 10 is electrically connected to the metal reinforcing plate 42 of the reinforcing member 40.

The shielded printed wiring board 101b achieves the same effects as those of the shielded printed wiring board 101a, although the structure of the electromagnetic wave shielding film is different.

Preferred structures, materials, and the like of the electromagnetic wave shielding film 20b of the shielded printed wiring board 101b are the same as those of the electromagnetic wave shielding film 20b of the shielded printed wiring board 1b.

Preferred structures, materials, and the like of the substrate film 10 and the reinforcing member 40 of the shielded printed wiring board 101b are the same as those of the substrate film 10 and the reinforcing member 40 of the shielded printed wiring board 1a.

Regarding the method of producing the shielded printed wiring board 101b, in the electromagnetic wave shielding film arrangement step (2) of the method of producing the shielded printed wiring board 101a, the electromagnetic wave shielding film 20a may be replaced by the electromagnetic wave shielding film 20b sequentially including the shielding layer 22b made of a conductive adhesive and the insulating layer 23b that are laminated.

In the shielded printed wiring board 101b shown in FIG. 16, the insulating layer 23b of the electromagnetic wave shielding film 20b includes projections and a depression attributable to the printed circuits 12b and the ground circuit 12a, respectively. However, in each of the shielded printed wiring boards of the present invention, the insulating layer of the electromagnetic wave shielding film may be flat without depressions and projections.

The following describes another shielded printed wiring board according to the second embodiment of the present invention.

Figure 17:
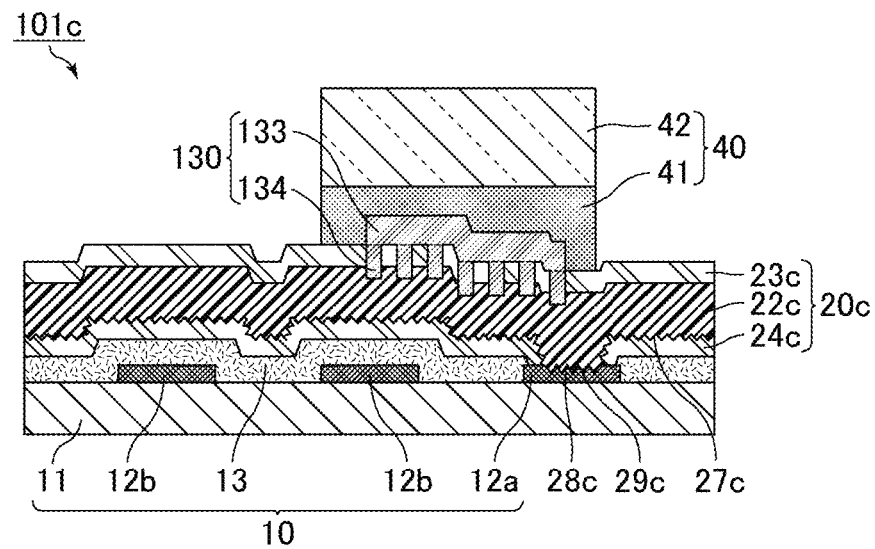
FIG. 17 is an exemplary schematic cross-sectional view of yet another shielded printed wiring board according to the second embodiment of the present invention.

FIG. 17 is an exemplary schematic cross-sectional view of yet another shielded printed wiring board according to the second embodiment of the present invention.

Another shielded printed wiring board 101c according to the second embodiment of the present invention has the same structure as that of the shielded printed wiring board 101a, except that the electromagnetic wave shielding film 20a of the shielded printed wiring board 101a is replaced by the electromagnetic wave shielding film 20c sequentially including the insulating adhesive layer 24c, the shielding layer 22c made of metal, and the insulating layer 23c that are laminated.

Specifically, as shown in FIG. 17, the shielded printed wiring board 101c includes the followings: the substrate film 10 including the base film 11, and the ground circuit 12a and the other printed circuits 12b formed on the base film 11; the electromagnetic wave shielding film 20c sequentially including the insulating adhesive layer 24c, the shielding layer 22c made of metal, and the insulating layer 23c that are laminated; the connecting member 130 including the metal foil 133 and the conductive protrusions 134 formed on the metal foil 133; and the reinforcing member 40 including the conductive adhesive layer 41 and the metal reinforcing plate 42.

The shielding layer 22c has the roughened surface 27c adjacent to the insulating adhesive layer 24c, and the roughened surface 27c includes the depressions 28c and the projections 29c.

In the shielded printed wiring board 101c, the printed circuits 12b of the substrate film 10 are covered by the coverlay 13, and the ground circuit 12a of the substrate film 10 is not covered by the coverlay 13.

In the shielded printed wiring board 101c, the electromagnetic wave shielding film 20c is arranged on the substrate film 10 in such a manner that the projections 29c, which are a part of the shielding layer 22c, penetrate the insulating adhesive layer 24c and are in contact with the ground circuit 12a of the substrate film 10.

In the shielded printed wiring board 101c, the printed circuits 12b of the substrate film 10 are covered by the coverlay 13, so that the printed circuits 12b are not in contact with the shielding layer 22c of the electromagnetic wave shielding film 20c.

In the shielded printed wiring board 101c, the connecting member 130 is arranged on the electromagnetic wave shielding film 20c in such a manner that the conductive protrusions 134 of the connecting member 130 penetrate the insulating layer 23c of the electromagnetic wave shielding film 20c and is in contact with the shielding layer 22c of the electromagnetic wave shielding film 20c.

In the shielded printed wiring board 101c, the reinforcing member 40 is arranged on the electromagnetic wave shielding film 20c and the connecting member 130 in such a manner that the conductive adhesive layer 41 of the reinforcing member 40 is in contact with the insulating layer 23c of the electromagnetic wave shielding film 20c and the metal foil 133 of the connecting member 130.

Further, in the shielded printed wiring board 101c, the ground circuit 12a of the substrate film 10 is electrically connected to the metal reinforcing plate 42 of the reinforcing member 40.

The shielded printed wiring board 101c achieves the same effects as those of the shielded printed wiring board 101a, although the structure of the electromagnetic wave shielding film is different.

Preferred structures, materials, and the like of the electromagnetic wave shielding film 20c of the shielded printed wiring board 101c are the same as those of the electromagnetic wave shielding film 20c of the shielded printed wiring board 1c.

Preferred structures, materials, and the like of the substrate film 10 and the reinforcing member 40 of the shielded printed wiring board 101c are the same as those of the substrate film 10 and the reinforcing member 40 of the shielded printed wiring board 1a.

Regarding the method of producing the shielded printed wiring board 101c, in the electromagnetic wave shielding film arrangement step (2) of the method of producing the shielded printed wiring board 101a, the electromagnetic wave shielding film 20a may be replaced by the electromagnetic wave shielding film 20c sequentially including the insulating adhesive layer 24c, the shielding layer 22c made of metal, and the insulating layer 23c that are laminated.

The projections 29c of the shielding layer 22c may not necessarily be penetrating the insulating adhesive layer 24c during the preparation of the electromagnetic wave shielding film 20c. In this case, pressure may be applied when laminating the electromagnetic wave shielding film 20c on the substrate film 10 in such a manner that the projections 29c of the shielding layer 22c of the electromagnetic wave shielding film 20c penetrate the insulating adhesive layer 24c and are in contact with the ground circuit 12a of the substrate film 10.

In the shielded printed wiring board 101c shown in FIG. 17, the insulating layer 23b of the electromagnetic wave shielding film 20c includes projections and a depression attributable to the printed circuits 12b and the ground circuit 12a, respectively. However, in each of the shielded printed wiring boards of the present invention, the insulating layer of the electromagnetic wave shielding film may be flat without depressions and projections.

Third Embodiment

The following describes a shielded printed wiring board according to a third embodiment of the present invention.

Figure 18:
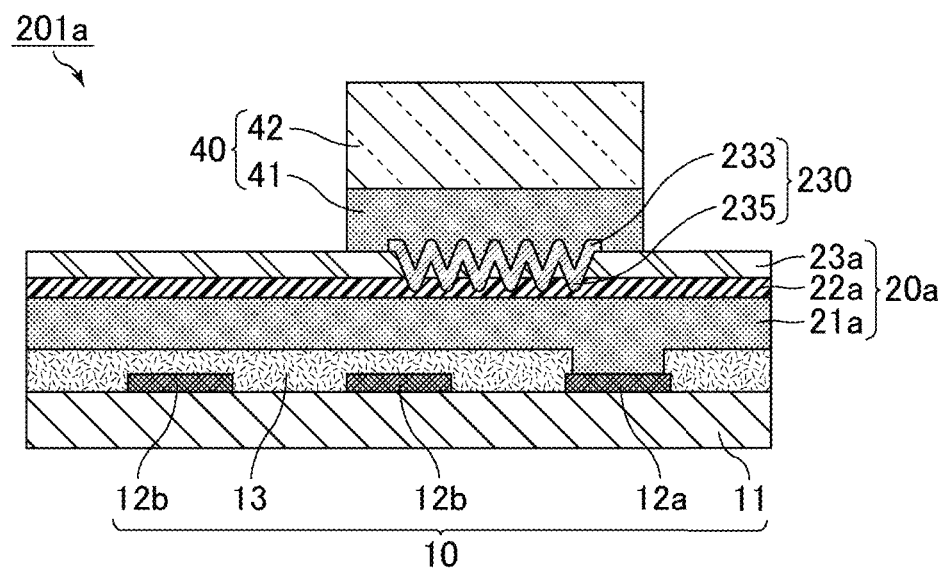
FIG. 18 is an exemplary schematic cross-sectional view of a shielded printed wiring board according to a third embodiment of the present invention.

FIG. 18 is an exemplary schematic cross-sectional view of the shielded printed wiring board according to the third embodiment of the present invention.

A shielded printed wiring board 201a according to the third embodiment of the present invention has the same structure as that of the shielded printed wiring board 1a, except that the connecting member 30 of the shielded printed wiring board 1a is replaced by a connecting member 230 including at least one fold portion 235 formed of a repeatedly folded metal foil 233.

Specifically, as shown in FIG. 18, the shielded printed wiring board 201a includes the followings: the substrate film 10 including the base film 11, and the ground circuit 12a and the other printed circuits 12b formed on the base film 11; the electromagnetic wave shielding film 20a sequentially including the conductive adhesive layer 21a, the shielding layer 22a, and the insulating layer 23a that are laminated; the connecting member 230 including the mountain fold portion 235 formed of the repeatedly folded the metal foil 233; and the reinforcing member 40 including the conductive adhesive layer 41 and the metal reinforcing plate 42.

In the shielded printed wiring board 201a, the connecting member 230 is arranged on the electromagnetic wave shielding film 20a in such a manner that the mountain fold portion 235 of the connecting member 230 penetrates the insulating layer 23a of the electromagnetic wave shielding film 20a and is in contact with the shielding layer 22a of the electromagnetic wave shielding film 20a.

The use of the connecting member 230 in the shielded printed wiring board 201a as described above allows the mountain fold portion 235 of the connecting member 230 to be sufficiently in contact with the shielding layer 22a of the electromagnetic wave shielding film 20a. This results in a low the electrical resistance value between the electromagnetic wave shielding film 20a and the connecting member 230.

As a result, in the shielded printed wiring board 201a, the ground circuit 12a of the substrate film 10 is sufficiently electrically connected to the metal reinforcing plate 42 of the reinforcing member 40.

The shielded printed wiring board according to the third embodiment of the present invention may be configured as follows: the insulating layer of the electromagnetic wave shielding film includes at least one of a projection or a depression, and the connecting member is arranged across a boundary of the at least one of a projection or a depression of the insulating layer of the electromagnetic wave shielding film.

The following describes, with reference to the drawing, the shielded printed wiring board according to the third embodiment of the present invention in which the insulating layer of the electromagnetic wave shielding film includes at least one of a depression or a projection.

Figure 19:
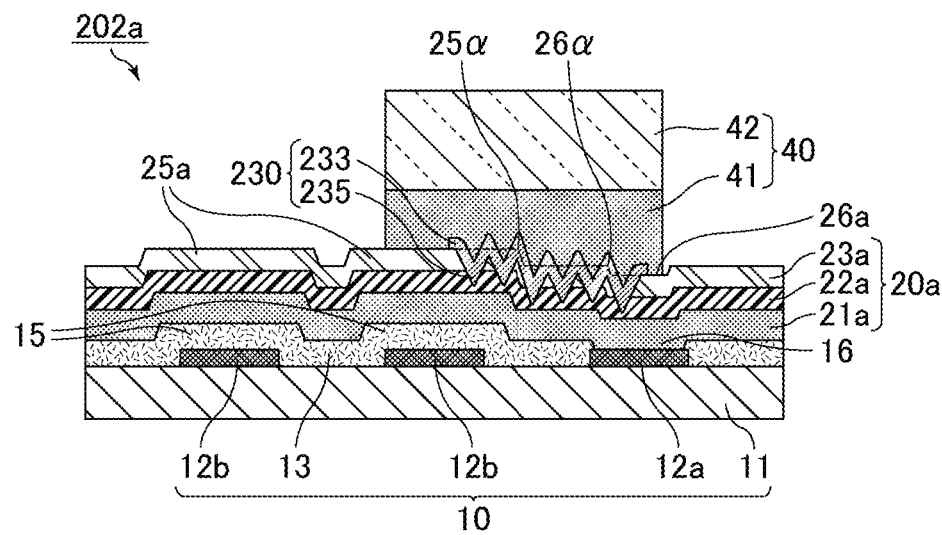
FIG. 19 is another exemplary schematic cross-sectional view of the shielded printed wiring board according to the third embodiment of the present invention.

FIG. 19 is another exemplary schematic cross-sectional view of the shielded printed wiring board according to the third embodiment of the present invention.

As shown in FIG. 19, a shielded printed wiring board 202a includes the substrate film 10, the electromagnetic wave shielding film 20a, the connecting member 230, and the reinforcing member 40, as is the case with the shielded printed wiring board 201a.

In the shielded printed wiring board 202a, the printed circuits 12b of the substrate film 10 are covered by the coverlay 13, and the ground circuit 12a of the substrate film 10 is not covered by the coverlay 13.

The substrate film 10 includes the projections 15 at portions corresponding to the printed circuits 12b covered by the coverlay 13. The substrate film 10 includes the depression 16 at a portion corresponding to the ground circuit 12a because the ground circuit 12a is not covered by the coverlay 13.

In the shielded printed wiring board 202a, the electromagnetic wave shielding film 20a is arranged on the substrate film 10 in such a manner that the conductive adhesive layer 21a of the electromagnetic wave shielding film 20a is in contact with the ground circuit 12a.

In the shielded printed wiring board 202a, the insulating layer 23a of the electromagnetic wave shielding film 20a includes the depression 26a and the projections 25a attributable to the depression 16 and the projections 15, respectively, of the substrate film 10.

In the shielded printed wiring board 202a, the connecting member 230 is arranged on the electromagnetic wave shielding film 20a in such a manner that the mountain fold portion 235 of the connecting member 230 penetrates the insulating layer 23a of the electromagnetic wave shielding film 20a and that the mountain fold portion 235 of the connecting member 230 is in contact with the shielding layer 22a of the electromagnetic wave shielding film 20a.

In the shielded printed wiring board 202a, the connecting member 230 is arranged across the boundary 26a of the depression 26a and the boundary 25a of the projection 25a of the insulating layer 23a of the electromagnetic wave shielding film 20a.

In the shielded printed wiring board 202a, the reinforcing member 40 is arranged on the electromagnetic wave shielding film 20a and the connecting member 230 in such a manner that the conductive adhesive layer 41 of the reinforcing member 40 is in contact with the insulating layer 23a of the electromagnetic wave shielding film 20a and the metal foil 233 of the connecting member 230.

Here, the metal foil 233 of the connecting member 230 is flexible and can easily change its shape. Thus, even when the insulating layer 23a of the electromagnetic wave shielding film 20a includes the depression 26a and the projections 25a, the metal foil 233 of the connecting member 230 can change its shape according to the shapes of the depression 26a and the projections 25a.

Thus, even when the insulating layer 23a of the electromagnetic wave shielding film 20a includes the depression 26a and the projections 25a, the mountain fold portion 235 of the connecting member 230 can sufficiently penetrate the insulating layer 23a of the electromagnetic wave shielding film 20a.

Thus, in the shielded printed wiring board 202a, the ground circuit 12a of the substrate film 10 is sufficiently electrically connected to the metal reinforcing plate 42 of the reinforcing member 40.

The following describes each structure of the shielded printed wiring board 201a.
(Connecting Member)

In the connecting member 230, the material of the metal foil 233 is not limited as long as it is a conductive metal. For example, preferably, the material includes at least one selected from the group consisting of copper, aluminum, silver, gold, nickel, chromium, titanium, zinc, and stainless steel.

These materials have excellent conductivity.

In the connecting member 230, the thickness of the metal foil 233 is preferably 0.1 µm or more, more preferably 1 µm or more.

A metal foil having a thickness of less than 0.1 µm has low strength and is easily breakable.

When the electromagnetic wave shielding film 20a includes at least one of a depression or a projection, preferably, the thickness of the metal foil 33 of the connecting member 30 is less than or equal to the distance corresponding to the depth of the depression or the height of the projection, whichever is greater. More preferably, the thickness is less than or equal to 50% of the distance corresponding to the depth of the depression or the height of the projection, whichever is greater.

When the thickness of the metal foil is more than the distance corresponding to the height of the projection or the depth of the projection of the insulating layer of the electromagnetic wave shielding film, whichever is greater, the metal foil reduces its flexibility and cannot easily change its shape according to the shape of the depression and/or projection of the insulating layer of the electromagnetic wave shielding film.

In the connecting member 230, the height of the mountain fold portion 235 is not limited as long as the mountain fold portion 235 can penetrate the insulating layer 23a of the electromagnetic wave shielding film 20a, but the height is preferably 2 to 30 µm.

Preferred structures, materials, and the like of the substrate film 10, the electromagnetic wave shielding film 20a, and the reinforcing member 40 of the shielded printed wiring board 201a are the same as those of the substrate film 10, the electromagnetic wave shielding film 20a, and the reinforcing member 40 of the shielded printed wiring board 1a.

The following describes a method of producing the shielded printed wiring board 201a.

This method of producing the shielded printed wiring board is an exemplary method of producing the shielded printed wiring board according to the third embodiment of the present invention.

The method of producing the shielded printed wiring board 201a may include a substrate film preparation step (1), an electromagnetic wave shielding film arrangement step (2), a connecting member arrangement step (3), and a reinforcing member arrangement step (4).

The following specifically describes each step with reference to the drawings.

Figure 20:
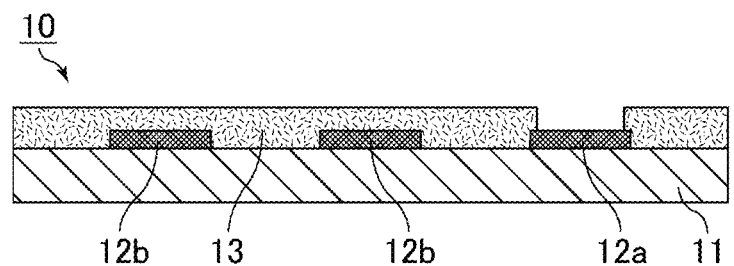
FIG. 20 is a schematic view of an exemplary substrate film preparation step according to the third embodiment of the present invention.

FIG. 20 is a schematic view of an exemplary substrate film preparation step according to the third embodiment of the present invention.

Figure 21A:
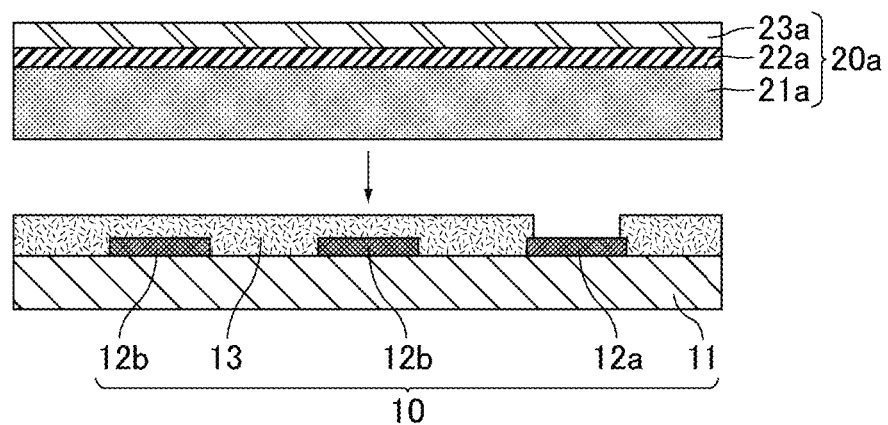
FIG. 21A is a schematic view of an exemplary electromagnetic wave shielding film arrangement step according to the third embodiment of the present invention.
Figure 21B:
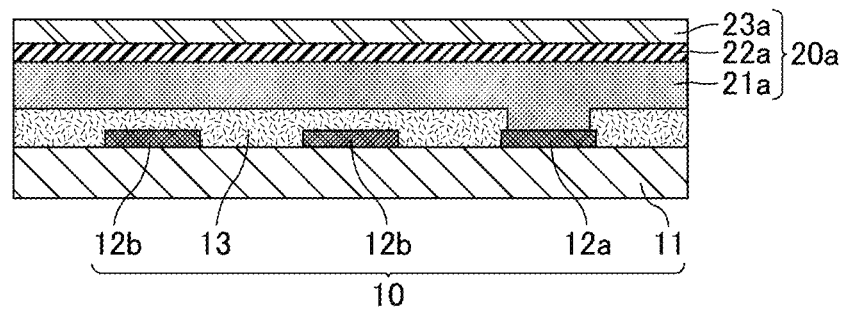
FIG. 21B is a schematic view of an exemplary electromagnetic wave shielding film arrangement step according to the third embodiment of the present invention.

FIG. 21A and FIG. 21B are schematic views of an exemplary electromagnetic wave shielding film arrangement step according to the third embodiment of the present invention.

Figure 22A:
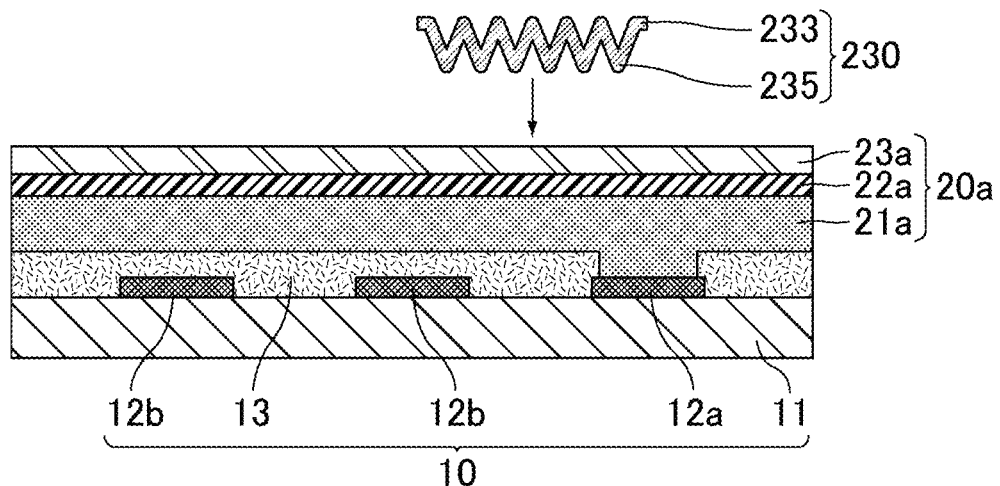
FIG. 22A is a schematic view of an exemplary connecting member arrangement step according to the third embodiment of the present invention.
Figure 22B:
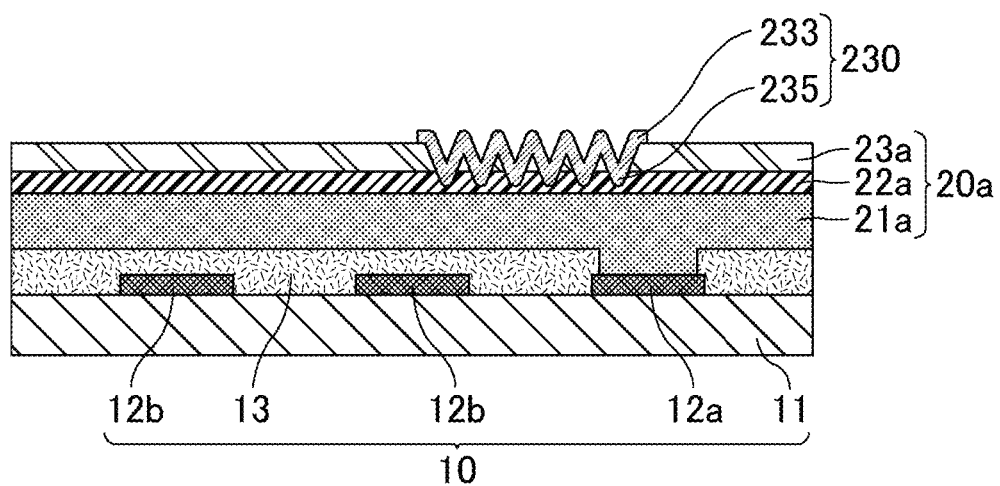
FIG. 22B is a schematic view of an exemplary connecting member arrangement step according to the third embodiment of the present invention.

FIG. 22A and FIG. 22B are schematic views of an exemplary connecting member arrangement step according to the third embodiment of the present invention.

Figure 23A:
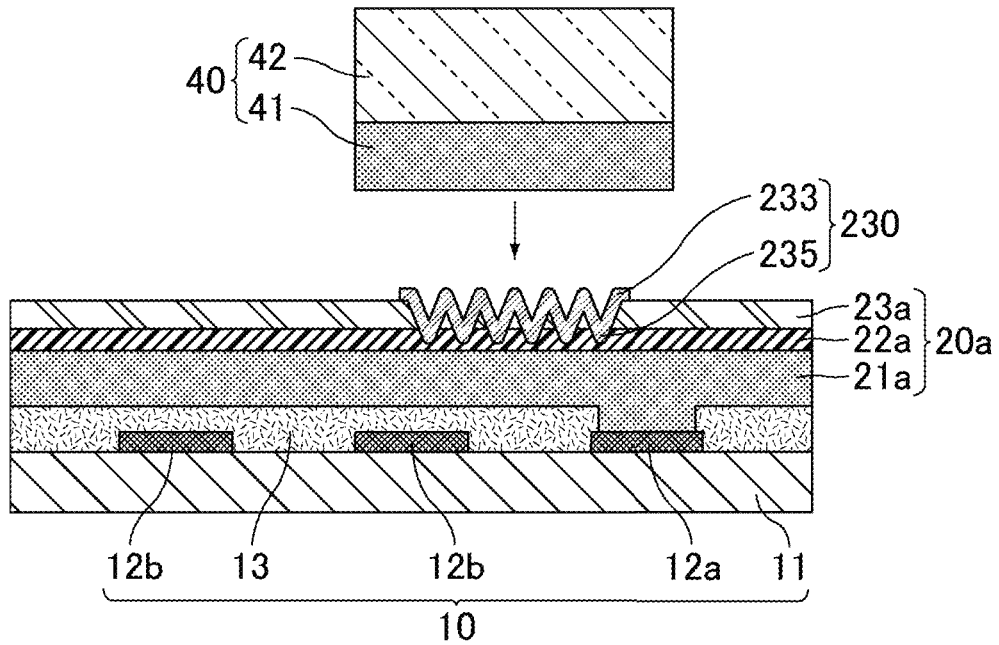
FIG. 23A is a schematic view of an exemplary reinforcing member arrangement step according to the third embodiment of the present invention.
Figure 23B:
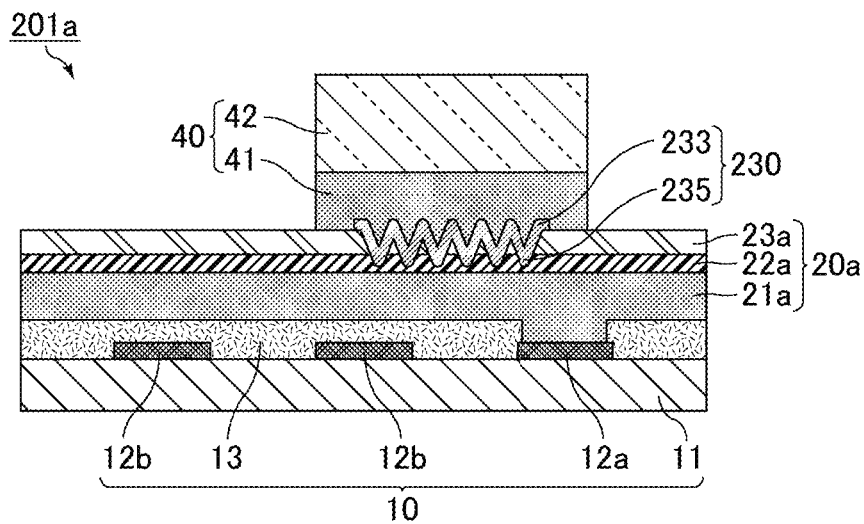
FIG. 23B is a schematic view of an exemplary reinforcing member arrangement step according to the third embodiment of the present invention.

FIG. 23A and FIG. 23B are schematic views of an exemplary reinforcing member arrangement step according to the third embodiment of the present invention.
(1) Substrate Film Preparation Step First, as shown in FIG. 20, the substrate film 10 is prepared which includes the base film 11, the ground circuit 12a and the other printed circuits 12b formed on the base film 11, and the coverlay 13 covering the printed circuit 12b.
(2) Electromagnetic Wave Shielding Film Arrangement Step Next, as shown in FIG. 21A, the electromagnetic wave shielding film 20a is prepared which sequentially includes the conductive adhesive layer 21a, the shielding layer 22a, and the insulating layer 23a that are laminated.

Then, as shown in FIG. 21B, the electromagnetic wave shielding film 20a is laminated on the substrate film 10 in such a manner that the conductive adhesive layer 21a of the electromagnetic wave shielding film 20a is in contact with the ground circuit 12a of the substrate film 10.
(3) Connecting Member Arrangement Step Next, as shown in FIG. 22A, the connecting member 230 including the mountain fold portion 235 formed of the repeatedly folded metal foil 233 is prepared.

Then, as shown in FIG. 22B, the connecting member 230 is arranged on the electromagnetic wave shielding film 20a by pressing the connecting member 230 against the electromagnetic wave shielding film 20a in such a manner that the mountain fold portion 235 of the connecting member 230 penetrates the insulating layer 23a of the electromagnetic wave shielding film 20a and is in contact with the shielding layer 22a of the electromagnetic wave shielding film 20a.
(4) Reinforcing Member Arrangement Step Next, as shown in FIG. 23A, the reinforcing member 40 including the conductive adhesive layer 41 and the metal reinforcing plate 42 is prepared.

Then, as shown in FIG. 23B, the reinforcing member 40 is arranged in such a manner that the conductive adhesive layer 41 of the reinforcing member 40 is in contact with the insulating layer 23a of the electromagnetic wave shielding film 20a and the metal foil 233 of the connecting member 230.

The shielded printed wiring board 201a can be produced by the above steps.

In the method of producing the shielded printed wiring board 201a, as shown in FIG. 21A and FIG. 21B, the insulating layer 23a of the electromagnetic wave shielding film 20a includes no depressions or projections. Yet, in the method of producing the shielded printed wiring board according to the third embodiment of the present invention, the insulating layer of the electromagnetic wave shielding film may include at least one of a projection or a depression, and in the connecting member arrangement step, the connecting member may be arranged across a boundary of the at least one of a projection or a depression of the insulating layer of the electromagnetic wave shielding film.

The metal foil of the connecting member is flexible and can easily change its shape. Thus, even when the insulating layer of the electromagnetic wave shielding film includes at least one of a depression or a projection, the metal foil can change its shape according to the shape of the at least one of a depression or a projection.

Thus, even when the insulating layer of the electromagnetic wave shielding film includes at least one of a depression or a projection, the mountain fold portion of the connecting member can sufficiently penetrate the insulating layer of the electromagnetic wave shielding film.

The connecting member 230, which is used in the method of producing the shielded printed wiring board 201a, is the connecting member of the present invention.

Use of such a connecting member in the production of a shielded printed wiring board makes it possible to produce a shielded printed wiring board in which the ground circuit of the substrate film is sufficiently electrically connected to the metal reinforcing plate of the reinforcing member.

The following describes another shielded printed wiring board according to the third embodiment of the present invention.

Figure 24:
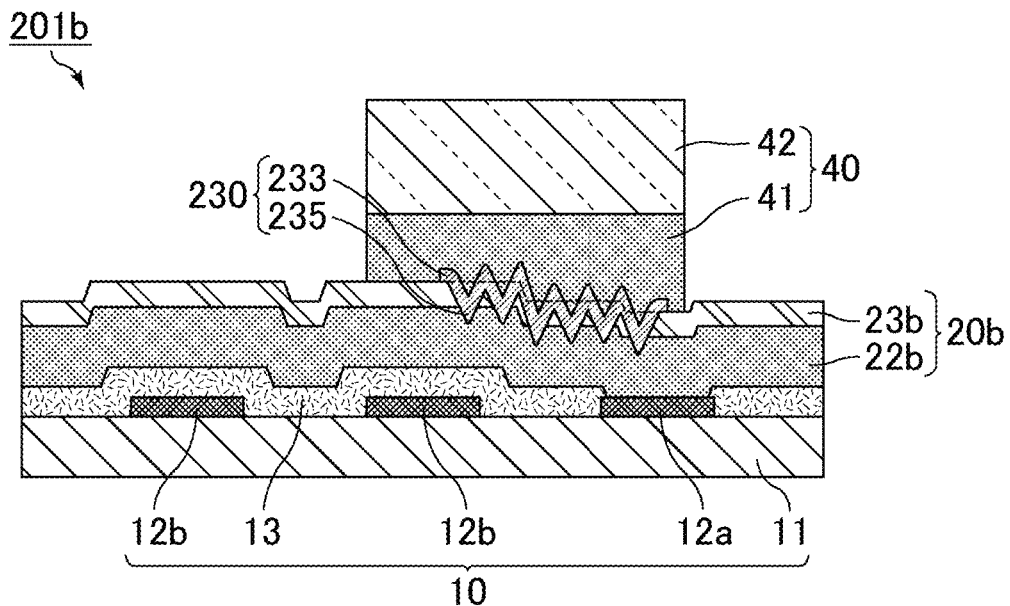
FIG. 24 is an exemplary schematic cross-sectional view of another shielded printed wiring board according to the third embodiment of the present invention.

FIG. 24 is an exemplary schematic cross-sectional view of another shielded printed wiring board according to the third embodiment of the present invention.

Another shielded printed wiring board 201b according to the third embodiment of the present invention has the same structure as that of the shielded printed wiring board 201a, except that the electromagnetic wave shielding film 20a of the shielded printed wiring board 201a is replaced by the electromagnetic wave shielding film 20b sequentially including the shielding layer 22b made of a conductive adhesive and the insulating layer 23b that are laminated.

Specifically, as shown in FIG. 24, the shielded printed wiring board 201b includes the followings: the substrate film 10 including the base film 11, and the ground circuit 12a and the other printed circuits 12b formed on the base film 11; the electromagnetic wave shielding film 20b sequentially including the shielding layer 22b made of a conductive adhesive and the insulating layer 23b that are laminated; the connecting member 230 including the mountain fold portion 235 formed of the repeatedly folded metal foil 233; and the reinforcing member 40 including the conductive adhesive layer 41 and the metal reinforcing plate 42.

In the shielded printed wiring board 201b, the printed circuits 12b of the substrate film 10 are covered by the coverlay 13, and the ground circuit 12a of the substrate film 10 is not covered by the coverlay 13.

In the shielded printed wiring board 201b, the electromagnetic wave shielding film 20b is arranged on the substrate film 10 in such a manner that the shielding layer 22b of the electromagnetic wave shielding film 20b is in contact with the ground circuit 12a of the substrate film 10.

In the shielded printed wiring board 201b, the printed circuits 12b of the substrate film 10 are covered by the coverlay 13, so that the printed circuits 12b are not in contact with the shielding layer 22b of the electromagnetic wave shielding film 20b.

In the shielded printed wiring board 201b, the connecting member 230 is arranged on the electromagnetic wave shielding film 20b in such a manner that the mountain fold portion 235 of the connecting member 230 penetrates the insulating layer 23b of the electromagnetic wave shielding film 20b and is in contact with the shielding layer 22b of the electromagnetic wave shielding film 20b.

In the shielded printed wiring board 201b, the reinforcing member 40 is arranged on the electromagnetic wave shielding film 20b and the connecting member 230 in such a manner that the conductive adhesive layer 41 of the reinforcing member 40 is in contact with the insulating layer 23b of the electromagnetic wave shielding film 20b and the metal foil 233 of the connecting member 230.

Further, in the shielded printed wiring board 201b, the ground circuit 12a of the substrate film 10 is electrically connected to the metal reinforcing plate 42 of the reinforcing member 40.

The shielded printed wiring board 201b achieves the same effects as those of the shielded printed wiring board 201a, although the structure of the electromagnetic wave shielding film is different.

Preferred structures, materials, and the like of the electromagnetic wave shielding film 20b of the shielded printed wiring board 201b are the same as those of the electromagnetic wave shielding film 20b of the shielded printed wiring board 1b.

Preferred structures, materials, and the like of the substrate film 10 and the reinforcing member 40 of the shielded printed wiring board 201b are the same as those of the substrate film 10 and the reinforcing member 40 of the shielded printed wiring board 1a.

Regarding the method of producing the shielded printed wiring board 201b, in the electromagnetic wave shielding film arrangement step (2) of the method of producing the shielded printed wiring board 201a, the electromagnetic wave shielding film 20a may be replaced by the electromagnetic wave shielding film 20b sequentially including the shielding layer 22b made of a conductive adhesive and the insulating layer 23b that are laminated.

In the shielded printed wiring board 201b shown in FIG. 24, the insulating layer 23b of the electromagnetic wave shielding film 20b includes projections and a depression attributable to the printed circuits 12b and the ground circuit 12a, respectively. However, in each of the shielded printed wiring boards of the present invention, the insulating layer of the electromagnetic wave shielding film may be flat without depressions and projections.

The following describes yet another shielded printed wiring board according to the third embodiment of the present invention.

Figure 25:
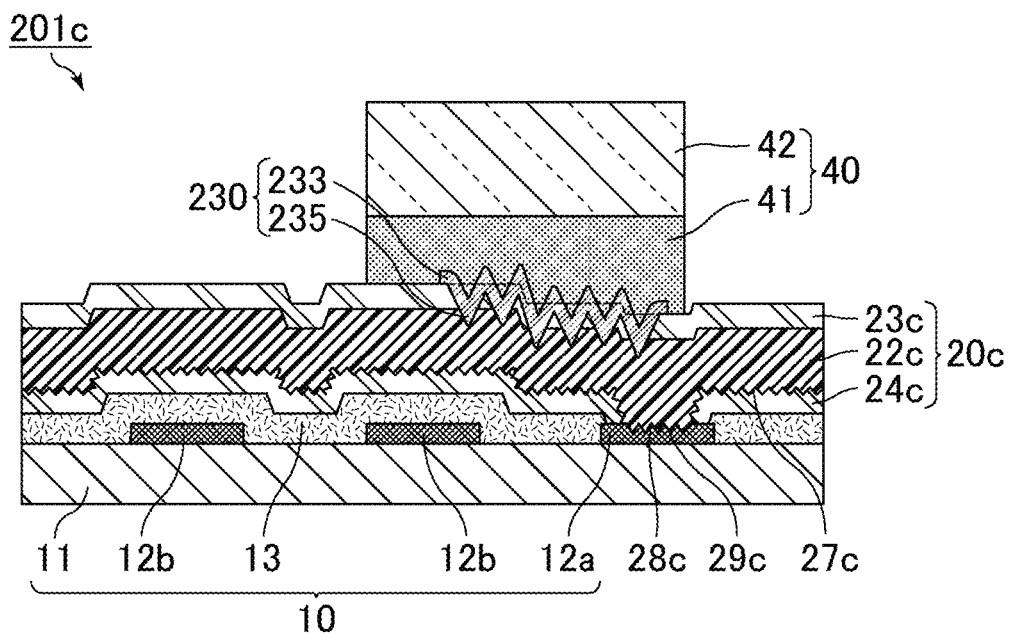
FIG. 25 is an exemplary schematic cross-sectional view of yet another shielded printed wiring board according to the third embodiment of the present invention.

FIG. 25 is an exemplary schematic cross-sectional view of yet another shielded printed wiring board according to the third embodiment of the present invention.

Another shielded printed wiring board 201c according to the third embodiment of the present invention has the same structure as that of the shielded printed wiring board 201a, except that the electromagnetic wave shielding film 20a of the shielded printed wiring board 201a is replaced by the electromagnetic wave shielding film 20c sequentially including the insulating adhesive layer 24c, the shielding layer 22c made of metal, and the insulating layer 23c that are laminated.

Specifically, as shown in FIG. 25, the shielded printed wiring board 201c includes the followings: the substrate film 10 including the base film 11, and the ground circuit 12a and the other printed circuits 12b formed on the base film 11; the electromagnetic wave shielding film 20c sequentially including the insulating adhesive layer 24c, the shielding layer 22c made of metal, and the insulating layer 23c that are laminated; the connecting member 230 including the mountain fold portion 235 formed of the repeatedly folded metal foil 233; and the reinforcing member 40 including the conductive adhesive layer 41 and the metal reinforcing plate 42.

The shielding layer 22c has the roughened surface 27c adjacent to the insulating adhesive layer 24c, and the roughened surface 27c includes the depressions 28c and the projections 29c.

In the shielded printed wiring board 201c, the printed circuits 12b of the substrate film 10 are covered by the coverlay 13, and the ground circuit 12a of the substrate film 10 is not covered by the coverlay 13.

In the shielded printed wiring board 201c, the electromagnetic wave shielding film 20c is arranged on the substrate film 10 in such a manner that the projections 29c, which are a part of the shielding layer 22c, penetrate the insulating adhesive layer 24c and are in contact with the ground circuit 12a of the substrate film 10.

In the shielded printed wiring board 201c, the printed circuits 12b of the substrate film 10 are covered by the coverlay 13, so that the printed circuits 12b are not in contact with the shielding layer 22c of the electromagnetic wave shielding film 20c.

In the shielded printed wiring board 201c, the connecting member 230 is arranged on the electromagnetic wave shielding film 20c in such a manner that the mountain fold portion 235 of the connecting member 230 penetrates the insulating layer 23c of the electromagnetic wave shielding film 20c and is in contact with the shielding layer 22c of the electromagnetic wave shielding film 20c.

In the shielded printed wiring board 201c, the reinforcing member 40 is arranged on the electromagnetic wave shielding film 20c and the connecting member 230 in such a manner that the conductive adhesive layer 41 of the reinforcing member 40 is in contact with the insulating layer 23c of the electromagnetic wave shielding film 20c and the metal foil 233 of the connecting member 230.

Further, in the shielded printed wiring board 201c, the ground circuit 12a of the substrate film 10 is electrically connected to the metal reinforcing plate 42 of the reinforcing member 40.

The shielded printed wiring board 201c achieves the same effects as those of the shielded printed wiring board 201a, although the structure of the electromagnetic wave shielding film is different.

Preferred structures, materials, and the like of the electromagnetic wave shielding film 20c of the shielded printed wiring board 201c are the same as those of the electromagnetic wave shielding film 20c of the shielded printed wiring board 1c.

Preferred structures, materials, and the like of the substrate film 10 and the reinforcing member 40 of the shielded printed wiring board 201c are the same as those of the substrate film 10 and the reinforcing member 40 of the shielded printed wiring board 1a.

Regarding the method of producing the shielded printed wiring board 201c, in the electromagnetic wave shielding film arrangement step (2) of the method of producing the shielded printed wiring board 201a, the electromagnetic wave shielding film 20a may be replaced by the electromagnetic wave shielding film 20c sequentially including the insulating adhesive layer 24c, the shielding layer 22c made of metal, and the insulating layer 23c that are laminated.

The projections 29c of the shielding layer 22c may not necessarily be penetrating the insulating adhesive layer 24c during the preparation of the electromagnetic wave shielding film 20c. In this case, pressure may be applied when laminating the electromagnetic wave shielding film 20c on the substrate film 10 in such a manner that the projections 29c of the shielding layer 22c of the electromagnetic wave shielding film 20c penetrate the insulating adhesive layer 24c and are in contact with the ground circuit 12a of the substrate film 10.

In the shielded printed wiring board 201c shown in FIG. 25, the insulating layer 23b of the electromagnetic wave shielding film 20c includes projections and a depression attributable to the printed circuits 12b and the ground circuit 12a, respectively. However, in each of the shielded printed wiring boards of the present invention, the insulating layer of the electromagnetic wave shielding film may be flat without depressions and projections.

REFERENCE SIGNS LIST 1a, 1b, 1c, 2a, 101a, 101b, 101c, 102a, 201a, 201b, 201c, 202a shielded printed wiring board
10 substrate film
11 base film
12a ground circuit
12b printed circuit
13 coverlay
15 projection
16 depression
20a, 20b, 20c electromagnetic wave shielding film
21a conductive adhesive layer
22a, 22b, 22c shielding layer
23a, 23b, 23c insulating layer
24c insulating adhesive layer
25a projection
25a boundary of projection
26a depression
26a boundary of depression
27c roughened surface
28c depression
29c projection
30, 130, 230 connecting member
31 conductive filler
32 adhesive resin
33, 133, 233 metal foil
40 reinforcing member
41 conductive adhesive layer
42 metal reinforcing plate
134 conductive protrusion
235 mountain fold portion

The invention claimed is:

1. A shielded printed wiring board comprising:
a substrate film including a base film and printed circuits including a ground circuit formed on the base film;
an electromagnetic wave shielding film including a shielding layer and an insulating layer;
a connecting member including a metal foil and a conductive filler fixed to the metal foil with an adhesive resin; and
a reinforcing member including a conductive adhesive layer and a metal reinforcing plate,
wherein the electromagnetic wave shielding film is arranged on the substrate film in such a manner that the insulating layer of the electromagnetic wave shielding film is located on the shielding layer of the electromagnetic wave shielding film,
the connecting member is arranged on the electromagnetic wave shielding film in such a manner that the conductive filler of the connecting member penetrates the insulating layer of the electromagnetic wave shielding film and that the conductive filler of the connecting member is in contact with the shielding layer of the electromagnetic wave shielding film,
the reinforcing member is arranged on the electromagnetic wave shielding film and the connecting member in such a manner that the conductive adhesive layer of the reinforcing member is in contact with the insulating layer of the electromagnetic wave shielding film and the metal foil of the connecting member, and
the ground circuit of the substrate film is electrically connected to the metal reinforcing plate of the reinforcing member,
wherein the insulating layer of the electromagnetic wave shielding film comprises one or more surface deviations comprising a projection or projections and/or a depression or depressions, and
the connecting member is arranged across a boundary or boundaries of the one or more surface deviations.

2. The shielded printed wiring board according to claim 1,
wherein the electromagnetic wave shielding film further comprises a conductive adhesive layer,
the electromagnetic wave shielding film sequentially comprises the conductive adhesive layer of the electromagnetic wave shielding film, the shielding layer of the electromagnetic wave shielding film, and the insulating layer of the electromagnetic wave shielding film that are laminated,
the shielding layer of the electromagnetic wave shielding film is made of metal, and
the conductive adhesive layer of the electromagnetic wave shielding film is in contact with the ground circuit of the substrate film.

3. The shielded printed wiring board according to claim 1,
wherein the electromagnetic wave shielding film sequentially comprises the shielding layer of the electromagnetic wave shielding film and the insulating layer of the electromagnetic wave shielding film that are laminated,
the shielding layer of the electromagnetic wave shielding film is made of a conductive adhesive, and
the shielding layer of the electromagnetic wave shielding film is in contact with the ground circuit of the substrate film.

4. The shielded printed wiring board according to claim 1,
wherein the electromagnetic wave shielding film further comprises an insulating adhesive layer,
the electromagnetic wave shielding film sequentially comprises the insulating adhesive layer of the electromagnetic wave shielding film, the shielding layer of the electromagnetic wave shielding film, and the insulating layer of the electromagnetic wave shielding film that are laminated,
the shielding layer of the electromagnetic wave shielding film is made of metal,
the shielding layer of the electromagnetic wave shielding film has a roughened surface adjacent to the insulating adhesive layer of the electromagnetic wave shielding film, and
a part of the shielding layer of the electromagnetic wave shielding film penetrates the insulating adhesive layer of the electromagnetic wave shielding film and is in contact with the ground circuit of the substrate film.

5. A shielded printed wiring board comprising:
a substrate film including a base film and printed circuits including a ground circuit formed on the base film;
an electromagnetic wave shielding film including a shielding layer and an insulating layer;
a connecting member including a metal foil and a conductive protrusion formed on the metal foil; and
a reinforcing member including a conductive adhesive layer and a metal reinforcing plate,
wherein the electromagnetic wave shielding film is arranged on the substrate film in such a manner that the insulating layer of the electromagnetic wave shielding film is located on the shielding layer of the electromagnetic wave shielding film,
the connecting member is arranged on the electromagnetic wave shielding film in such a manner that the conductive protrusion of the connecting member penetrates the insulating layer of the electromagnetic wave shielding film and that the conductive protrusion of the connecting member is in contact with the shielding layer of the electromagnetic wave shielding film,
the reinforcing member is arranged on the electromagnetic wave shielding film and the connecting member in such a manner that the conductive adhesive layer of the reinforcing member is in contact with the insulating layer of the electromagnetic wave shielding film and the metal foil of the connecting member, and
the ground circuit of the substrate film is electrically connected to the metal reinforcing plate of the reinforcing member,
wherein the insulating layer of the electromagnetic wave shielding film comprises one or more surface deviations comprising a projection or projections and/or a depression or depressions, and
the connecting member is arranged across a boundary or boundaries of the one or more surface deviations.

6. The shielded printed wiring board according to claim 5,
wherein the electromagnetic wave shielding film further comprises a conductive adhesive layer,
the electromagnetic wave shielding film sequentially comprises the conductive adhesive layer of the electromagnetic wave shielding film, the shielding layer of the electromagnetic wave shielding film, and the insulating layer of the electromagnetic wave shielding film that are laminated,
the shielding layer of the electromagnetic wave shielding film is made of metal, and
the conductive adhesive layer of the electromagnetic wave shielding film is in contact with the ground circuit of the substrate film.

7. The shielded printed wiring board according to claim 5,
wherein the electromagnetic wave shielding film sequentially comprises the shielding layer of the electromagnetic wave shielding film and the insulating layer of the electromagnetic wave shielding film that are laminated, the shielding layer of the electromagnetic wave shielding film is made of a conductive adhesive, and the shielding layer of the electromagnetic wave shielding film is in contact with the ground circuit of the substrate film.

8. The shielded printed wiring board according to claim 5, wherein the electromagnetic wave shielding film further comprises an insulating adhesive layer, the electromagnetic wave shielding film sequentially comprises the insulating adhesive layer of the electromagnetic wave shielding film, the shielding layer of the electromagnetic wave shielding film, and the insulating layer of the electromagnetic wave shielding film that are laminated, the shielding layer of the electromagnetic wave shielding film is made of metal, the shielding layer of the electromagnetic wave shielding film has a roughened surface adjacent to the insulating adhesive layer of the electromagnetic wave shielding film, and a part of the shielding layer of the electromagnetic wave shielding film penetrates the insulating adhesive layer of the electromagnetic wave shielding film and is in contact with the ground circuit of the substrate film.

9. A shielded printed wiring board comprising:

a substrate film including a base film and printed circuits including a ground circuit formed on the base film;

an electromagnetic wave shielding film including a shielding layer and an insulating layer;

a connecting member including a mountain fold portion formed of a repeatedly folded metal foil; and a reinforcing member including a conductive adhesive layer and a metal reinforcing plate, wherein the electromagnetic wave shielding film is arranged on the substrate film in such a manner that the insulating layer of the electromagnetic wave shielding film is located on the shielding layer of the electromagnetic wave shielding film, the connecting member is arranged on the electromagnetic wave shielding film in such a manner that the mountain fold portion of the connecting member penetrates the insulating layer of the electromagnetic wave shielding film and that the mountain fold portion of the connecting member is in contact with the shielding layer of the electromagnetic wave shielding film, the reinforcing member is arranged on the electromagnetic wave shielding film and the connecting member in such a manner that the conductive adhesive layer of the reinforcing member is in contact with the insulating layer of the electromagnetic wave shielding film and the metal foil of the connecting member, and the ground circuit of the substrate film is electrically connected to the metal reinforcing plate of the reinforcing member, wherein the insulating layer of the electromagnetic wave shielding film comprises one or more surface deviations comprising a projection or projections and/or a depression or depressions, and the connecting member is arranged across a boundary or boundaries of the one or more surface deviations.

10. The shielded printed wiring board according to claim 9, wherein the electromagnetic wave shielding film further comprises a conductive adhesive layer, the electromagnetic wave shielding film sequentially comprises the conductive adhesive layer of the electromagnetic wave shielding film, the shielding layer of the electromagnetic wave shielding film, and the insulating layer of the electromagnetic wave shielding film that are laminated, the shielding layer of the electromagnetic wave shielding film is made of metal, and the conductive adhesive layer of the electromagnetic wave shielding film is in contact with the ground circuit of the substrate film.

11. The shielded printed wiring board according to claim 9, wherein the electromagnetic wave shielding film sequentially comprises the shielding layer of the electromagnetic wave shielding film and the insulating layer of the electromagnetic wave shielding film that are laminated, the shielding layer of the electromagnetic wave shielding film is made of a conductive adhesive, and the shielding layer of the electromagnetic wave shielding film is in contact with the ground circuit of the substrate film.

12. The shielded printed wiring board according to claim 9, wherein the electromagnetic wave shielding film further comprises an insulating adhesive layer, the electromagnetic wave shielding film sequentially comprises the insulating adhesive layer of the electromagnetic wave shielding film, the shielding layer of the electromagnetic wave shielding film, and the insulating layer of the electromagnetic wave shielding film that are laminated, the shielding layer of the electromagnetic wave shielding film is made of metal, the shielding layer of the electromagnetic wave shielding film has a roughened surface adjacent to the insulating adhesive layer of the electromagnetic wave shielding film, and a part of the shielding layer of the electromagnetic wave shielding film penetrates the insulating adhesive layer of the electromagnetic wave shielding film and is in contact with the ground circuit of the substrate film.

13. A method of producing a shielded printed wiring board, comprising:

a substrate film preparation step of preparing a substrate film including a base film and printed circuits including a ground circuit formed on the base film;

an electromagnetic wave shielding film arrangement step of laminating an electromagnetic wave shielding film including a shielding layer and an insulating layer on the substrate film in such a manner that the insulating layer of the electromagnetic wave shielding film is located on the shielding layer of the electromagnetic wave shielding film;

a connecting member arrangement step of arranging a connecting member including a metal foil and a conductive filler fixed to the metal foil with an adhesive resin on the electromagnetic wave shielding film in such a manner that the conductive filler of the connecting member penetrates the insulating layer of the electromagnetic wave shielding film and is in contact with the shielding layer of the electromagnetic wave shielding film; and a reinforcing member arrangement step of arranging a reinforcing member including a conductive adhesive layer and a metal reinforcing plate in such a manner that the conductive adhesive layer of the reinforcing member is in contact with the insulating layer of the electromagnetic wave shielding film and the metal foil of the connecting member, wherein the insulating layer of the electromagnetic wave shielding film comprises one or more surface deviations comprising a projection or projections and/or a depression or depressions, and in the connecting member arrangement step, the connecting member is arranged across a boundary or boundaries of the one or more surface deviations.

14. A method of producing a shielded printed wiring board, comprising:

a substrate film preparation step of preparing a substrate film including a base film and printed circuits including a ground circuit formed on the base film;

an electromagnetic wave shielding film arrangement step of laminating an electromagnetic wave shielding film including a shielding layer and an insulating layer on the substrate film in such a manner that the insulating layer of the electromagnetic wave shielding film is located on the shielding layer of the electromagnetic wave shielding film;

a connecting member arrangement step of arranging a connecting member including a metal foil and a conductive protrusion formed on the metal foil on the electromagnetic wave shielding film in such a manner that the conductive protrusion of the connecting member penetrates the insulating layer of the electromagnetic wave shielding film and is in contact with the shielding layer of the electromagnetic wave shielding film; and a reinforcing member arrangement step of arranging a reinforcing member including a conductive adhesive layer and a metal reinforcing plate in such a manner that the conductive adhesive layer of the reinforcing member is in contact with the insulating layer of the electromagnetic wave shielding film and the metal foil of the connecting member, wherein the insulating layer of the electromagnetic wave shielding film comprises one or more surface deviations comprising a projection or projections and/or a depression or depressions, and in the connecting member arrangement step, the connecting member is arranged across a boundary or boundaries of the one or more surface deviations.

15. A method of producing a shielded printed wiring board, comprising:

a substrate film preparation step of preparing a substrate film including a base film and printed circuits including a ground circuit formed on the base film;

an electromagnetic wave shielding film arrangement step of laminating an electromagnetic wave shielding film including a shielding layer and an insulating layer on the substrate film in such a manner that the insulating layer of the electromagnetic wave shielding film is located on the shielding layer of the electromagnetic wave shielding film;

a connecting member arrangement step of arranging a connecting member including a mountain fold portion formed of a repeatedly folded metal foil on the electromagnetic wave shielding film in such a manner that the mountain fold portion of the connecting member penetrates the insulating layer of the electromagnetic wave shielding film and is in contact with the shielding layer of the electromagnetic wave shielding film; and a reinforcing member arrangement step of arranging a reinforcing member including a conductive adhesive layer and a metal reinforcing plate in such a manner that the conductive adhesive layer of the reinforcing member is in contact with the insulating layer of the electromagnetic wave shielding film and the metal foil of the connecting member, wherein the insulating layer of the electromagnetic wave shielding film comprises one or more surface deviations comprising a projection or projections and/or a depression or depressions, and in the connecting member arrangement step, the connecting member is arranged across a boundary or boundaries of the one or more surface deviations.

* * * * *